(12) United States Patent
Arai et al.

(10) Patent No.: US 8,318,554 B2
(45) Date of Patent: Nov. 27, 2012

(54) METHOD OF FORMING GATE INSULATING FILM FOR THIN FILM TRANSISTORS USING PLASMA OXIDATION

(75) Inventors: Yasuyuki Arai, Atsugi (JP); Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 71 days.

(21) Appl. No.: 11/410,083

(22) Filed: Apr. 25, 2006

(65) Prior Publication Data

US 2006/0246633 A1    Nov. 2, 2006

(30) Foreign Application Priority Data

Apr. 28, 2005   (JP) .................................. 2005-133713

(51) Int. Cl.
*H01L 21/00* (2006.01)
*H01L 21/84* (2006.01)
(52) U.S. Cl. ......... 438/166; 438/149; 438/153; 438/154
(58) Field of Classification Search .................. 438/771, 438/772, 154, 164, 287, 153, 165, 770, 166, 438/149, 311; 257/E21.625, E21.639
See application file for complete search history.

(56) References Cited

U.S. PATENT DOCUMENTS

| | | | |
|---|---|---|---|
| 4,727,044 A | 2/1988 | Yamazaki | |
| 5,485,019 A | 1/1996 | Yamazaki et al. | |
| 5,757,456 A | 5/1998 | Yamazaki et al. | |
| 5,956,581 A | 9/1999 | Yamazaki et al. | |
| 5,969,397 A * | 10/1999 | Grider et al. | 257/410 |
| 6,127,199 A | 10/2000 | Inoue et al. | |
| 6,150,203 A * | 11/2000 | Yamazaki et al. | 438/164 |
| 6,235,563 B1 * | 5/2001 | Oka et al. | 438/166 |
| 6,297,103 B1 * | 10/2001 | Ahn et al. | 438/275 |
| 6,426,245 B1 | 7/2002 | Kawasaki et al. | |

(Continued)

FOREIGN PATENT DOCUMENTS

CN    1485891    3/2004

(Continued)

OTHER PUBLICATIONS

*The Advancing Introduction of Plasma Oxynitriding Apparatus Adopted by More Than 10 LSI Makers*, Nikkei Microdevices, Apr. 2005, pp. 100-103.

(Continued)

*Primary Examiner* — Chuong A. Luu
(74) *Attorney, Agent, or Firm* — Eric J. Robinson; Robinson Intellectual Property Law Office, P.C.

(57) ABSTRACT

In forming a thin film transistor, to form a film superior in quality to a film formed by a conventional CVD method and to form a film equal or superior in quality to a film formed by a thermal oxidation method at a temperature which does not affect a substrate. Plasma oxidation or plasma nitridation with a low electron temperature and a high electron density is performed to at least one of a glass substrate, a semiconductor film containing amorphous silicon formed into a predetermined pattern, a gate electrode and a wire pulled from the gate electrode, an insulating film to be a gate insulating film, and a protective film with a temperature of the glass substrate set at a temperature 100° C. or more lower than a strain point of the glass substrate.

9 Claims, 11 Drawing Sheets

U.S. PATENT DOCUMENTS

| | | |
|---|---|---|
| 6,519,136 B1 | 2/2003 | Chu et al. |
| 6,521,912 B1 | 2/2003 | Sakama et al. |
| 6,534,421 B2 * | 3/2003 | Kakkad .................. 438/771 |
| 6,534,826 B2 | 3/2003 | Yamazaki |
| 6,555,420 B1 | 4/2003 | Yamazaki |
| 6,642,117 B1 * | 11/2003 | Chen et al. .................. 438/287 |
| 6,674,502 B1 * | 1/2004 | Terakado et al. ............. 349/147 |
| 6,716,761 B2 | 4/2004 | Mitsuiki |
| 6,773,996 B2 | 8/2004 | Suzawa et al. |
| 6,800,512 B1 * | 10/2004 | Itonaga et al. ................ 438/154 |
| 6,818,852 B2 | 11/2004 | Ohmi et al. |
| 6,919,282 B2 | 7/2005 | Sakama et al. |
| 6,975,018 B2 | 12/2005 | Ohmi et al. |
| 7,081,640 B2 | 7/2006 | Uchida et al. |
| 7,098,147 B2 | 8/2006 | Nansei et al. |
| 7,303,945 B2 * | 12/2007 | Seko et al. .................. 438/149 |
| 7,364,954 B2 | 4/2008 | Kuwashima et al. |
| 7,410,839 B2 | 8/2008 | Isobe et al. |
| 7,491,656 B2 * | 2/2009 | Ohmi ............................ 438/788 |
| 2002/0020497 A1 | 2/2002 | Ohmi et al. |
| 2004/0002226 A1 * | 1/2004 | Burnham et al. ............. 438/776 |
| 2004/0007748 A1 * | 1/2004 | Sakama et al. ............... 257/410 |
| 2004/0050494 A1 | 3/2004 | Ohmi et al. |
| 2004/0142577 A1 * | 7/2004 | Sugawara et al. ............ 438/772 |
| 2004/0217431 A1 | 11/2004 | Shimada |
| 2005/0057136 A1 | 3/2005 | Moriya et al. |
| 2005/0062407 A1 | 3/2005 | Suh et al. |
| 2005/0084994 A1 | 4/2005 | Yamazaki et al. |
| 2005/0158665 A1 | 7/2005 | Maekawa et al. |
| 2005/0196973 A1 | 9/2005 | Suzuki et al. |
| 2005/0263835 A1 | 12/2005 | Sakama et al. |
| 2005/0285102 A1 | 12/2005 | Koo et al. |
| 2006/0033107 A1 * | 2/2006 | Lee et al. .................. 257/66 |
| 2006/0055314 A1 | 3/2006 | Nakamura et al. |
| 2006/0105114 A1 * | 5/2006 | White .......................... 427/569 |
| 2006/0121694 A1 | 6/2006 | Tamura |
| 2006/0154492 A1 | 7/2006 | Ide et al. |
| 2006/0156984 A1 | 7/2006 | Nozawa et al. |
| 2006/0228899 A1 | 10/2006 | Nansei et al. |
| 2006/0244063 A1 | 11/2006 | Isobe et al. |
| 2006/0246640 A1 | 11/2006 | Kuwashima et al. |
| 2006/0246644 A1 | 11/2006 | Isobe et al. |
| 2006/0246738 A1 | 11/2006 | Isobe et al. |
| 2006/0270066 A1 | 11/2006 | Imahayashi et al. |
| 2008/0032511 A1 | 2/2008 | Kabe et al. |

FOREIGN PATENT DOCUMENTS

| | | |
|---|---|---|
| EP | 1 394 853 | 3/2004 |
| EP | 1 617 483 | 1/2006 |
| EP | 1 622 194 | 2/2006 |
| EP | 1632994 A | 3/2006 |
| JP | 64-004070 A | 1/1989 |
| JP | 03-001572 A | 1/1991 |
| JP | 06-013615 | 1/1994 |
| JP | 06-338492 A | 12/1994 |
| JP | 07-094740 A | 4/1995 |
| JP | 07-161996 A | 6/1995 |
| JP | 08-254686 | 10/1996 |
| JP | 10-125929 | 5/1998 |
| JP | 2001-135824 | 5/2001 |
| JP | 2001-147424 A | 5/2001 |
| JP | 2002-217170 | 8/2002 |
| JP | 2002-261091 | 9/2002 |
| JP | 2002-270843 A | 9/2002 |
| JP | 2004-319952 | 11/2004 |
| JP | 2005-026468 | 1/2005 |
| JP | 2005-093737 | 4/2005 |
| WO | WO 2004/017396 | 2/2004 |
| WO | WO 2004/107430 | 12/2004 |
| WO | WO 2005/004223 | 1/2005 |

OTHER PUBLICATIONS

Office Action (Application No. 200610077222.9) dated Feb. 6, 2009.
Office Action (CN Application No. 200610077222.9) dated Mar. 23, 2010.
Korean Office Action (Application No. 2006-0037493) Dated Jul. 12, 2012.

* cited by examiner

METHOD OF FORMING GATE INSULATING FILM FOR THIN FILM TRANSISTORS USING PLASMA OXIDATION

BACKGROUND OF THE INVENTION

1. Field of the Invention

The present invention disclosed in this specification relates to a semiconductor device having a thin film transistor such as formation of a gate insulating film of a thin film transistor or a protective film of a gate electrode.

2. Description of the Related Art

A thin film transistor is widely known as a switching element used in an active matrix display device. In a manufacturing process of a thin film transistor, a CVD method or a thermal oxidation method has conventionally been employed in general so as to form an insulating film.

However, there has been a problem in that a silicon oxide film formed by a CVD method is inferior to a silicon oxide film obtained by a thermal oxidation method in film quality, such that the silicon oxide film formed by a CVD method lacks in density, contains much impurities such as carbon, and suffers a damage due to plasma (plasma damage).

On the contrary, in order to efficiently form a silicon oxide film having a predetermined thickness with high quality by a thermal oxidation method, it is required to oxidize silicon in an oxygen atmosphere at a temperature of 800° C. or more. Thus, in the case of employing a thermal oxidation method in forming a gate insulating film of a thin film transistor, a glass substrate typified by non-alkali glass cannot be used and a quartz substrate which is more expensive than the glass substrate is forced to be used.

In addition, when thermal oxidation is performed to silicon having a corner portion, a thickness of a silicon oxide film formed over the corner portion of the silicon becomes thinner in some cases, compared with a thickness of a silicon oxide film formed over a roughly plane portion of a top surface of the silicon. This is because oxidation is suppressed due to stress caused by a shape of the corner portion.

In the future, it is required to make a thinner gate insulating film than ever before in accordance with more miniaturization of a thin film transistor. For example, although a gate insulating film is conventionally formed with a thickness of 100 nm or more, it is required to be formed with a thickness of several tens of nm. However, in the case of using a silicon oxide film formed by the above-described conventional method as a gate insulating film, the thinner the thickness thereof becomes, the more the amount of leakage current flowing between a semiconductor film including a channel formation region and a gate electrode via the thin silicon oxide film is increased. Further, in a case where a silicon oxide film formed as a gate insulating film does not have a uniform thickness and locally has a thin portion, there is a possibility of generating leakage current via the thin portion.

As a material for forming the gate insulating film, silicon oxynitride (denoted by $SiO_xN_y$, note that x>y) is sometimes used instead of silicon oxide. However, heat treatment at a high temperature exceeding a strain point of a glass substrate is required to form the silicon oxynitride film by heat treatment in an atmosphere such as $N_2O$ which is capable of performing nitridation.

Recently, a method of forming a gate insulating film of a field effect transistor for an LSI with a plasma treatment apparatus which is capable of performing plasma oxidation and plasma nitridation has been focused. For example, it is disclosed in Reference 1 that a silicon nitride film to be a gate insulating film is formed over a semiconductor layer by directly reacting nitrogen activated by plasma excitation with silicon of the semiconductor layer (Reference 1: Japanese Patent Laid-Open No. 2004-319952). However, according to Reference 1, disclosed are only an example of using an SOI (Silicon On Insulator) substrate and a point that the semiconductor layer may be a bulk semiconductor substrate, and an attempt to form a gate insulating film of a thin film transistor with an apparatus capable of performing plasma oxidation and plasma nitridation is not disclosed.

SUMMARY OF THE INVENTION

It is an object of the present invention disclosed in this specification to obtain an insulating film, in a manufacturing process of a thin film transistor, which is superior in quality to an insulating film formed by a film formation method of a conventional CVD method. It is another object of the invention to obtain an insulating film having an equal or superior quality to an insulating film formed by heat treatment at a high temperature using a thermal oxidation method, at a temperature which does not affect a glass substrate. It is a further object of the invention to form a protective film (passivation film) over a gate electrode of a thin film transistor by a similar method to the case of the above-described insulating film. This protective film (passivation film) is also called a barrier film. The insulating film mentioned above has to have a sufficient quality as a gate insulating film of a thin film transistor, and the protective film mentioned above has to have a sufficient quality as a protective film formed in contact with a gate electrode of a thin film transistor.

An apparatus capable of performing plasma oxidation and plasma nitridation is used in forming a gate insulating film of a thin film transistor or in forming a protective film of a gate electrode of a thin film transistor. In this apparatus, plasma is excited in a chamber using microwaves, and an electron temperature of 1.5 eV or less (preferably 1.0 eV or less) and an electron density of $1 \times 10^{11}$ cm$^{-3}$ or more can be concurrently achieved with no magnetic field over a treatment subject such as a semiconductor film, an insulating film, or a gate electrode. In this specification, this apparatus is hereinafter called a high-density plasma treatment apparatus. Accordingly, since it becomes possible to generate plasma with high density at a low electron temperature, plasma damages to a gate insulating film and a protective film to be formed can be suppressed.

The plasma is an ionized gas in which approximately equal amounts of electrons having negative charge and ions having positive charge exist, and is electrically natural on the whole. Note that the number of electrons or the number of ions included per unit area of the plasma is called a plasma density, and the plasma density indicates an electron density in the invention disclosed in this specification. In addition, radicals which are electrically natural are generated in the plasma, and the radicals affect a treatment subject which is subjected to plasma treatment. Thus, plasma oxidation and plasma nitridation hereinafter described in this specification is, in some cases, called radical oxidation and radical nitridation, respectively.

One feature of the invention disclosed in this specification is a manufacturing method of a thin film transistor including the steps of forming a base insulating film over a glass substrate, forming a predetermined pattern of a semiconductor film containing amorphous silicon over the base insulating film, forming an insulating film (gate insulating film) by performing plasma oxidation or plasma nitridation to the semiconductor film containing amorphous silicon having the predetermined pattern with a condition where a temperature of the glass substrate is set at a temperature 100° C. or more lower than a strain point of the glass substrate, and forming a gate electrode and a wire pulled from the gate electrode over the insulating film. The plasma oxidation or plasma nitridation mentioned above is performed above the glass substrate which is set away from a plasma generation region in an apparatus including a plasma treatment chamber in which an electron temperature of 0.5 eV or more and 1.5 eV or less and an electron density of $1 \times 10^{11}$ cm$^{-3}$ or more and $1 \times 10^{13}$ cm$^{-3}$ or less are concurrently achieved with no magnetic field. After performing the plasma oxidation, the plasma nitridation may be further performed, or after performing the plasma nitridation, the plasma oxidation may be further performed. In addition, the plasma nitridation may be performed to the glass substrate.

One feature of the invention disclosed in this specification is a manufacturing method of a thin film transistor including the steps of forming a base insulating film over a glass substrate, forming a predetermined pattern of a semiconductor film containing amorphous silicon over the base insulating film, forming an insulating film over the semiconductor film containing amorphous silicon having the predetermined pattern, forming a gate electrode and a wire pulled from the gate electrode over the insulating film, and forming a protective film by performing plasma oxidation or plasma nitridation to the gate electrode and the wire with a condition where a temperature of the glass substrate is set at a temperature 100° C. or more lower than a strain point of the glass substrate. The plasma nitridation mentioned above is performed above the glass substrate which is set away from a plasma generation region in an apparatus including a plasma treatment chamber in which an electron temperature of 0.5 eV or more and 1.5 eV or less and an electron density of $1 \times 10^{11}$ cm$^{-3}$ or more and $1 \times 10^{13}$ cm$^{-3}$ or less are concurrently achieved with no magnetic field. The plasma nitridation may be performed to the glass substrate.

One feature of the invention disclosed in this specification is a manufacturing method of a thin film transistor including the steps of forming a base insulating film over a glass substrate, forming a predetermined pattern of a semiconductor film containing amorphous silicon over the base insulating film, forming a gate insulating film by performing plasma oxidation or plasma nitridation to the semiconductor film containing amorphous silicon having the predetermined pattern with a condition where a temperature of the glass substrate is set at a temperature 100° C. or more lower than a strain point of the glass substrate, forming a gate electrode and a wire pulled from the gate electrode over the gate insulating film, and forming a protective film by performing plasma oxidation or plasma nitridation to the gate electrode and the wire with a temperature of the glass substrate set at 100° C. or more lower than a strain point of the glass substrate. The plasma oxidation or plasma nitridation mentioned above is performed above the glass substrate which is set away from a plasma generation region in an apparatus including a plasma treatment chamber in which an electron temperature of 0.5 eV or more and 1.5 eV or less and an electron density of $1 \times 10^{11}$ cm$^{-3}$ or more and $1 \times 10^{13}$ cm$^{-3}$ or less are concurrently achieved with no magnetic field. After performing the plasma oxidation, the plasma nitridation may be further performed, or after performing the plasma nitridation, the plasma oxidation may be further performed so as to form the gate insulating film. The plasma nitridation may be performed to the glass substrate.

One feature of the invention disclosed in this specification is a manufacturing method of a thin film transistor including the steps of forming a base insulating film over a glass substrate, forming a predetermined pattern of a semiconductor film containing amorphous silicon over the base insulating film, forming an insulating film over the semiconductor film containing amorphous silicon having the predetermined pattern, performing plasma oxidation or plasma nitridation to the insulating film with a condition where a temperature of the glass substrate is set at a temperature 100° C. or more lower than a strain point of the glass substrate so as to form a gate insulating film, and forming a gate electrode and a wire pulled from the gate electrode over the gate insulating film. The plasma oxidation or plasma nitridation mentioned above is performed above the glass substrate which is set away from a plasma generation region in an apparatus including a plasma treatment chamber in which an electron temperature of 0.5 eV or more and 1.5 eV or less and an electron density of $1 \times 10^{11}$ cm$^{-3}$ or more and $1 \times 10^{13}$ cm$^{-3}$ or less are concurrently achieved with no magnetic field. A silicon oxide film containing nitrogen, a silicon oxide film, a silicon nitride film, or a silicon nitride film containing oxygen formed by a CVD method or the like can be given as an example of the insulating film. The plasma nitridation may be performed to the glass substrate.

One feature of the invention disclosed in this specification is a manufacturing method of a thin film transistor including the steps of forming a base insulating film over a glass substrate, forming a predetermined pattern of a semiconductor film containing amorphous silicon over the base insulating film, forming an insulating film over the semiconductor film containing amorphous silicon having the predetermined pattern, performing plasma oxidation or plasma nitridation to the insulating film with a condition where a temperature of the glass substrate is set at a temperature 100° C. or more lower than a strain point of the glass substrate so as to form a gate insulating film, forming a gate electrode and a wire pulled from the gate electrode over the gate insulating film, and forming a protective film by performing plasma oxidation or plasma nitridation to the gate electrode and the wire with a temperature of the glass substrate set at 100° C. or more lower than a strain point of the glass substrate. The plasma oxidation or plasma nitridation mentioned above is performed above the glass substrate which is set away from a plasma generation region in an apparatus including a plasma treatment chamber in which an electron temperature of 0.5 eV or more and 1.5 eV or less and an electron density of $1 \times 10^{11}$ cm$^{-3}$ or more and $1 \times 10^{13}$ cm$^{-3}$ or less are concurrently achieved with no magnetic field. A silicon oxide film containing nitrogen, a silicon oxide film, a silicon nitride film, or a silicon nitride film containing oxygen formed by a CVD method or the like can be given as an example of the insulating film. The plasma nitridation may be performed to the glass substrate.

The invention disclosed in this specification is not limited to a top-gate (planar) thin film transistor, and can also be applied to a manufacturing process of a bottom-gate thin film transistor.

In a case where the bottom-gate thin film transistor is manufactured, a gate electrode and a wire pulled from the gate electrode can be formed without forming a base insulating film over a glass substrate. Then, an insulating film is formed over the gate electrode, and a gate insulating film is formed by performing plasma oxidation or plasma nitridation to this insulating film with a condition where a temperature of the glass substrate is set at a temperature 100° C. or more lower than a strain point of the glass substrate. Over the gate insulating film, a semiconductor film containing amorphous silicon is formed, and the bottom-gate thin film transistor is thereafter completed by a known method. The plasma oxidation or plasma nitridation mentioned above is performed above the glass substrate which is set away from a plasma generation region in an apparatus including a plasma treatment chamber in which an electron temperature of 0.5 eV or more and 1.5 eV or less and an electron density of $1\times10^{11}$ cm$^{-3}$ or more and $1\times10^{13}$ cm$^{-3}$ or less are concurrently achieved with no magnetic field. A silicon oxide film containing nitrogen, a silicon oxide film, a silicon nitride film, or a silicon nitride film containing oxygen formed by a CVD method or the like can be given as an example of the insulating film. The plasma oxidation or plasma nitridation may be performed to the gate electrode and the wire pulled from the gate electrode.

The electron temperature of 0.5 eV or more and 1.5 eV or less and the electron density of $1\times10^{11}$ cm$^{-3}$ or more and $1\times10^{13}$ cm$^{-3}$ or less set in each of the above-described methods are conditions for reducing plasma damages and sufficiently performing either of plasma oxidation or plasma nitridation. In addition, a reason for setting the temperature of the glass substrate at a temperature 100° C. or more lower than the strain point of the glass substrate is because heat resistance of the glass substrate is considered. In the case of using a glass substrate having a strain point of 650° C. or more, the temperature 100° C. or more lower than the strain point is preferably 550° C. or lower Since a glass substrate using alkali glass or non-alkali glass has a strain point of over 500° C., plasma oxidation or plasma nitridation can be performed at a temperature of 400° C. or lower which is a temperature 100° C. or more lower than the strain point of the glass substrate. In addition, the temperature of the glass substrate is necessarily 200° C. or more, and is preferably 250° C. or more to perform plasma oxidation or plasma nitridation with the above-described high-density plasma treatment apparatus.

Instead of the glass substrate, a heat-resistant plastic substrate can be used. Thermoplastic polyimide (TPI) is one of the heat-resistant plastic. A temperature of the heat-resistant plastic substrate in performing plasma oxidation or plasma nitridation is necessarily set equal to or lower than a glass transition point of the heat-resistant plastic substrate used and 200° C. or more. In the case of the invention disclosed in this specification, it is preferable to use a heat-resistant plastic having a glass transition point of 200° C. or more and preferably 250° C. or more. In addition, a quartz substrate having higher heat resistance than that of the glass substrate may be used.

By the plasma oxidation or the plasma nitridation, an oxide (oxide film) or nitride (nitride film) is formed on a surface of a semiconductor film containing amorphous silicon, an insulating film, a protective film, or a glass substrate. An active matrix display device is manufactured by using a thin film transistor including such an oxide (oxide film) or nitride (nitride film). In addition, an active matrix display device is manufactured by using a thin film transistor including a semiconductor film containing amorphous silicon, an insulating film, or a protective film subjected to the plasma oxidation or the plasma nitridation.

According to the invention disclosed in this specification, a dense and thin gate insulating film having a uniform thickness in which plasma damages and generation of cracks are suppressed can be formed at a temperature which does not affect a glass substrate or a heat-resistant plastic substrate. A thin film transistor formed with such a gate insulating film generates less leakage current via the gate insulating film than ever before. In addition, a step of forming a gate insulating film by a film formation method such as a CVD method can be omitted.

According to the invention disclosed in this specification, by performing plasma oxidation or plasma nitridation to an insulating film formed by a known film formation method such as a CVD method, for example, a silicon oxide film containing nitrogen or a silicon nitride film, a dense gate insulating film can be formed at a temperature which does not affect a glass substrate or a heat-resistant plastic substrate. A thin film transistor using such a gate insulating film generates less leakage current via the gate insulating film than ever before. Further, a particle (dust) over a surface of a film (not limited to an insulating film) formed by a film formation method such as a CVD method or a sputtering method can be easily removed, and an impurity such as carbon in the film can be removed by plasma oxidation.

In addition, according to the invention disclosed in this specification, since a dense protective film having a uniform thickness in which plasma damages are suppressed can be formed, heat resistance, corrosion resistance, and oxidation resistance of a gate electrode and a wire pulled from the gate electrode can be improved. In addition, a step of forming a protective film by a film formation method such as a CVD method can be omitted.

DETAILED DESCRIPTION OF THE INVENTION

In embodiment modes described below, examples of performing plasma oxidation or plasma nitridation in forming a thin film transistor will be described. Each embodiment mode shall be appropriately implemented in combination with each other.

Embodiment Mode 1

Figure 1A:
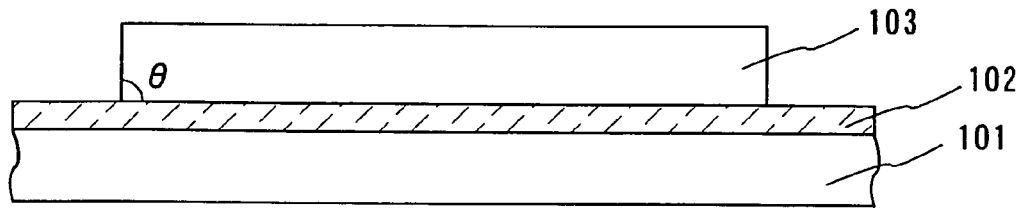
FIGS. 1A to 1D are cross-sections showing a manufacturing process of a thin film transistor corresponding to Embodiment Mode 1.

As shown in FIG. 1A, a base insulating film 102 is formed over a glass substrate 101. Instead of using a glass substrate, a heat-resistant plastic substrate can be used. A structure formed of one layer or a multilayer can be employed for the base insulating film 102, and in Embodiment Mode 1, a silicon nitride film containing oxygen and a silicon oxide film containing nitrogen (silicon oxynitride film) thereover are continuously formed by a CVD method or the like. The purpose of forming the base insulating film 102 is to prevent diffusion of impurities from the glass substrate 101 to a semiconductor film later to be formed. Accordingly, since a silicon oxide film is not sufficient to achieve this purpose, a silicon nitride film or a silicon nitride film containing oxygen which can more effectively prevent diffusion of impurities than the silicon oxide film, needs to be formed. In addition, the silicon oxide film is superior to the silicon nitride film in attachment to silicon.

A semiconductor film 103 containing amorphous silicon is formed with a predetermined pattern, over the base insulating film 102. In this embodiment mode, a semiconductor film containing amorphous silicon is formed by a CVD method or the like over an entire surface of the base insulating film 102, and is later formed into a predetermined pattern in a photolithography step. In the case where the semiconductor film containing amorphous silicon is formed by a CVD method or the like, it may be formed to contain germanium. In addition, the semiconductor film containing amorphous silicon before being formed into the predetermined pattern may be doped with impurities imparting p-type conductivity or impurities imparting n-type conductivity. A thickness of the semiconductor film 103 containing amorphous silicon has to be determined with considering the decreasing thereof in later performing plasma oxidation or plasma nitridation.

An angle θ of a side surface of the semiconductor film 103 with respect to a surface of the glass substrate 101 or the base insulating film 102 is in the range of 85° to 100°. Note that in forming the semiconductor film into a predetermined pattern, it may be formed into a tapered shape so that the angle θ is in the range of 30° to 60°.

Figure 2A:
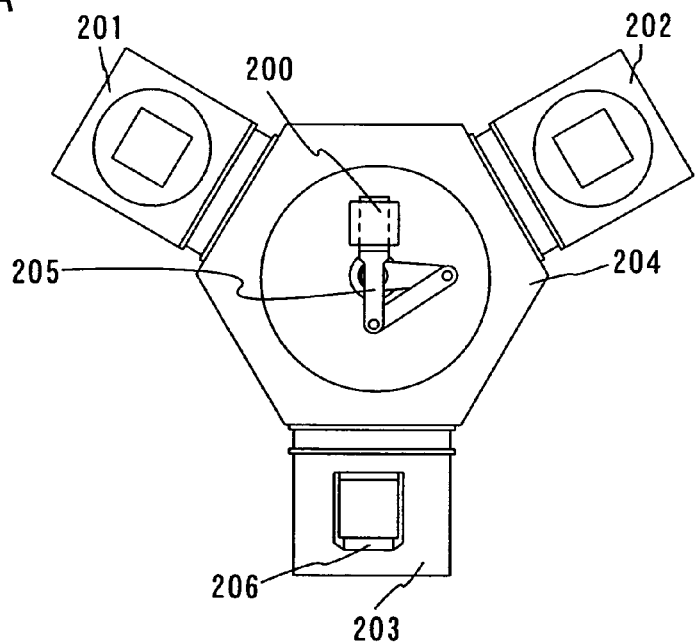
FIGS. 2A and 2B show an apparatus capable of performing plasma oxidation and plasma nitridation.
Figure 2B:
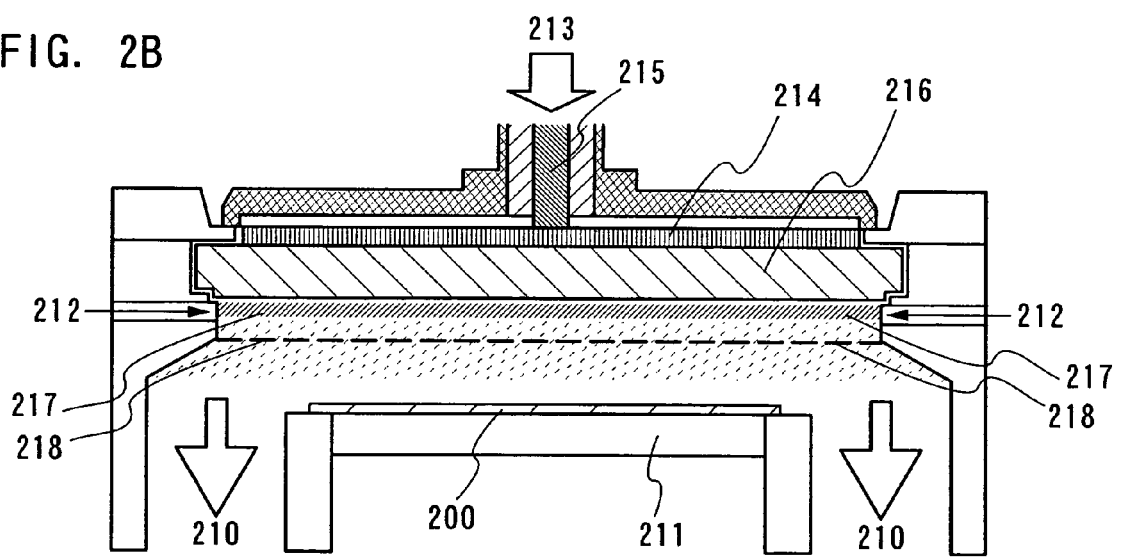

Plasma treatment is performed to the semiconductor film 103 with a high-density plasma treatment apparatus shown in FIGS. 2A and 2B. FIGS. 2A and 2B show an example of the high-density plasma treatment apparatus, and the invention is not limited to the structure shown in theses drawings.

The high-density plasma treatment apparatus includes, as shown in FIG. 2A, at least a first plasma treatment chamber 201, a second plasma treatment chamber 202, a load lock chamber 203, and a common chamber 204. Plasma oxidation is performed in the first plasma treatment chamber 201, and plasma nitridation is performed in the second plasma treatment chamber 202. Each chamber of FIG. 2A is vacuum evacuated, and plasma oxidation and plasma nitridation can be continuously performed without exposing to air. The high-density plasma treatment apparatus may further includes at least one of a chamber for CVD, a chamber for sputtering, and a chamber for thermal annealing, in addition to the chambers shown in FIG. 2A, and thereby can continuously perform film formation and plasma treatment, or plasma treatment and thermal annealing without exposing to air.

A robot arm 205 is provided in the common chamber 204. In the load lock chamber 203, a cassette 206 in which a plurality of treatment substrates 200 is stored is provided. One treatment substrate 200 stored in the cassette 206 can be transferred to the first plasma treatment chamber 201 or the second plasma treatment chamber 202 through the common chamber 204 by using the robot arm 205. In addition, the treatment substrate 200 can be transferred from the first plasma treatment chamber 201 to the second plasma treatment chamber 202 through the common chamber 204 by using the robot arm 205, or can be reversely transferred from the second plasma treatment chamber 202 to the first plasma treatment chamber 201 through the common chamber 204 as well.

FIG. 2B shows a common structure in the first plasma treatment chamber 201 and the second plasma treatment chamber 202. A vacuum pump (not shown) capable of reducing the pressure to a predetermined value is connected to the first plasma treatment chamber 201 and the second plasma treatment chamber 202, and air is exhausted from an exhaust port 210. In addition, a substrate holder 211 is provided in the first plasma treatment chamber 201 and the second plasma treatment chamber 202, and the treatment substrate 200 to be subjected to plasma oxidation or plasma nitridation is held on the substrate holder 211. This substrate holder 211 is also called a stage, and it is provided with a heater so as to heat the treatment substrate 200. A gas such as oxygen, nitrogen, hydrogen, a rare gas, or ammonia is introduced into the plasma treatment chamber from a gas introduction opening as indicated by an arrow 212. Microwaves 213 for exciting plasma are introduced through a waveguide 215 provided over an antenna 214. Plasma is generated in a shaded area 217 just below a dielectric plate 216 with a pressure in the plasma treatment chamber after introducing the above-mentioned gas of 5 Pa or more and 500 Pa or less, and is supplied onto the treatment substrate 200 which is provided away from the area 217. A shower plate 218 having a plurality of holes may be provided as shown in FIG. 2B. Plasma obtained in this plasma treatment chamber has an electron temperature of 1.5 eV or less and an electron density of $1 \times 10^{11}$ cm$^{-3}$ or more, in other words, achieves a low electron temperature and a high electron density, and has a plasma potential of 0 V or more and 5 V or less. Plasma parameters about an electron temperature, an electron density, and a plasma potential can be measured by a known method, for example, a probe measuring method such as a double probe method.

In this embodiment mode, oxygen, hydrogen, and argon are introduced into the first plasma treatment chamber 201 with a flow ratio of $O_2$:$H_2$:Ar=1:1:100, and plasma is generated using microwaves having a frequency of 2.45 GHz. Plasma oxidation can be performed without introducing hydrogen; however, a flow ratio of hydrogen to oxygen ($H_2$/$O_2$) is preferably set in the range of 0 to 1.5. For example, an oxygen flow is set in the range of 0.1 sccm to 100 sccm, an argon flow is set in the range of 100 sccm to 5000 sccm, and, in the case of introducing hydrogen, a hydrogen flow is set in the range of 0.1 to 100 sccm. Instead of argon, another rare gas may be introduced. A pressure in the first plasma treatment chamber 201 is set at an appropriate value in the range of 5 Pa to 500 Pa. The glass substrate 101 is provided on the substrate holder 211 of the first plasma treatment chamber 201, and a temperature of the heater provided under the substrate holder 211 is kept at 400° C. Then, plasma oxidation is performed to the semiconductor film 103 over the glass substrate 101. In this embodiment mode, as is apparently shown in FIG. 1B, a portion of the base insulating film 102, which is not covered by the semiconductor film 103, is also plasma oxidized. Note that in the case where the base insulating film 102 is made from an oxide, an oxide film is not formed over a surface of the base insulating film 102 even when plasma oxidation is performed.

Figure 1B:
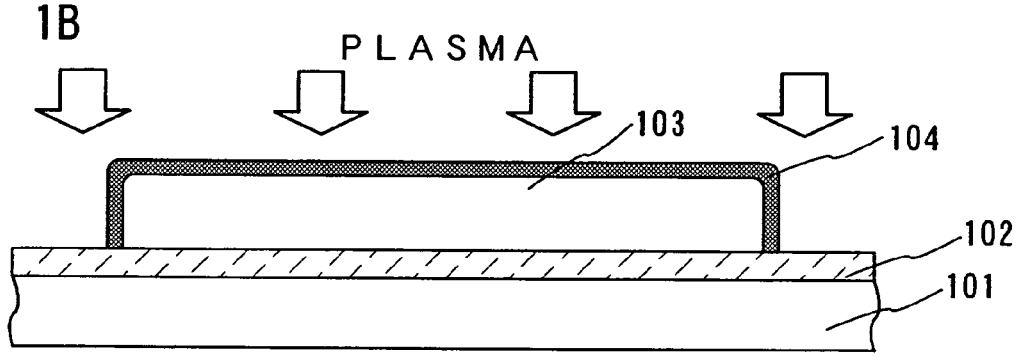

By the plasma oxidation described above, an oxide film 104 to be a gate insulating film shown in FIG. 1B is formed with a thickness of 20 nm or less. In the oxide film 104, argon introduced into the first plasma treatment chamber 201 is contained with a predetermined concentration, for example $1 \times 10^{15}$ atoms/cm$^3$ or more and $1 \times 10^{16}$ atoms/cm$^3$ or less. When the oxide film 104 is formed too thin, tunneling current (leakage current) may be generated. Accordingly, the thickness is set at 10 nm, for example. Since a corner portion of the semiconductor film 103 becomes rounded when forming the oxide film 104, a thickness of the oxide film 104 formed over the corner portion does not become thinner than that of other portions. In addition, there is no possibility of causing a crack in the oxide film 104 over the corner portion. In the case of using a heat-resistant plastic substrate instead of using the glass substrate 101, a temperature of the heater provided under the substrate holder 211 is, for example, kept at 250° C.

Since plasma over the semiconductor film 103 has an electron temperature of 1.5 eV or less and an electron density of $1 \times 10^{11}$ cm$^{-3}$ or more, plasma damages to the oxide film 104 obtained by plasma oxidation are suppressed. By using microwaves of 2.45 GHz so as to generate plasma, a low electron temperature and a high electron density can be more easily realized than in the case of using a frequency of 13.56 MHz. In addition, as long as a low electron temperature and a high electron density can be obtained, a method other the method using microwaves of 2.45 GHz may be employed.

The oxide film 104 may be used as a gate insulating film; however, if plasma nitridation is further performed to the oxide film 104 in the second plasma treatment chamber 202 to form into a silicon oxynitride film, the silicon oxynitride film can be used as a gate insulating film. As a gas introduced into the second plasma treatment chamber 202 in plasma nitridation, nitrogen and argon are used, and a temperature of the glass substrate is set at the same temperature as in the case of the above-described plasma oxidation. Hydrogen may be further added to the nitrogen and argon, and another rare gas may be used instead of using argon. Instead of nitrogen, a gas such as ammonia or N$_2$O which is used in performing nitridation by heat treatment with a high temperature can be used. The oxide film 104 contains a predetermined concentration of the rare gas which has been introduced into the second plasma treatment chamber 202.

Plasma nitridation may be first performed to the semiconductor film 103 in the second plasma treatment chamber 202 to form a nitride film. Further, plasma oxidation may be performed to the nitride film in the first plasma treatment chamber 201.

In the case of performing thermal oxidation to the semiconductor film 103 in an oxygen atmosphere, an edge portion of the semiconductor film 103, which is in contact with the base film 102, is oxidized unintentionally. As a result, such a problem occurs that a thickness of the edge portion of the semiconductor film 103 becomes thinner than that of other portions. This problem of thinning the film causes trouble particularly when the semiconductor film 103 has a tapered shape. However, when plasma oxidation is performed, oxidation in an unintended portion as described above is suppressed. The same can be said for the case of plasma nitridation.

After forming the oxide film 104, a silicon nitride film or a silicon nitride film containing oxygen may be formed by a CVD method or the like so as to form a gate insulating film together with the oxide film 104. Thus, oxidation of a gate electrode 105 and a wire pulled from the gate electrode 105 later to be formed due to having contact with the oxide film 104 can be suppressed. Further, plasma nitridation with a low electron temperature and a high electron density may be performed to the silicon nitride film or the silicon nitride film containing oxygen for the purpose of densification.

Figure 1C:
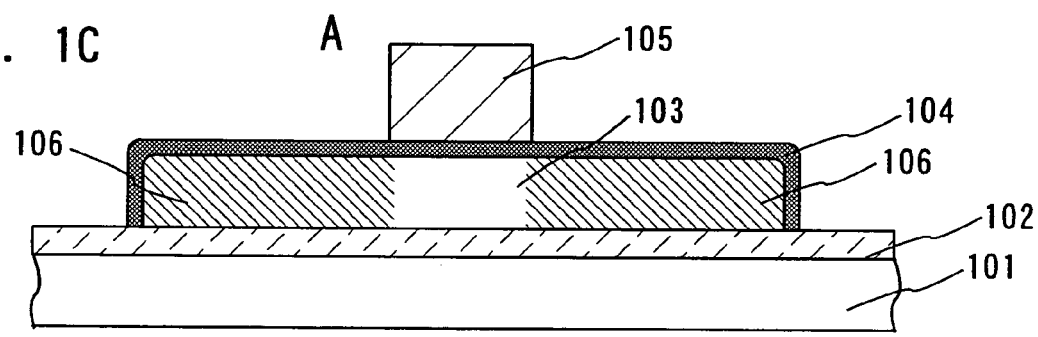

Then, the gate electrode 105 and the wire pulled from the gate electrode 105 are formed as shown in FIG. 1C. The gate electrode 105 and the wire pulled from the gate electrode 105 may be formed into a tapered shape, and a stack structure including two or more layers may be employed. Then, the semiconductor film 103 is doped with impurities imparting p-type conductivity or impurities imparting n-type conductivity and the impurities are activated to form an impurity region 106 including a source region and a drain region. The impurity region 106 may include an LDD region as well as the source region and the drain region. In addition, the LDD region may be formed to overlap the gate electrode 105.

Figure 1D:
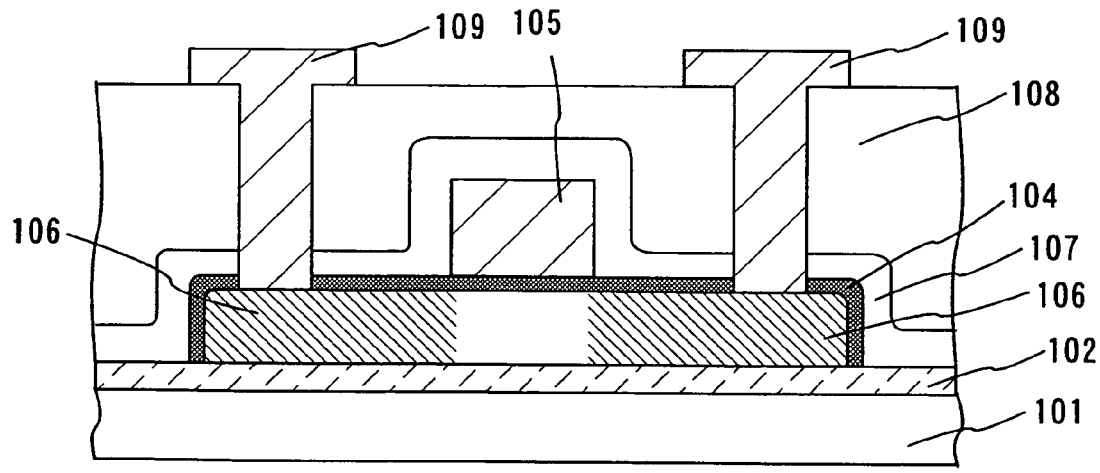

A protective film 107 and an interlayer insulating film 108 are formed to cover the gate electrode 105 and the wire pulled from the gate electrode 105, and contact holes exposing the source region and the drain region are formed in the gate insulating film, the protective film 107, and the interlayer insulating film 108. Then, wires 109 are formed to fill these contact holes and over the interlayer insulating film 108 (see FIG. 1D). In forming the protective film 107, a silicon nitride film or a silicon nitride film containing oxygen is formed by a plasma CVD method or the like. Plasma treatment with a low electron temperature and a high electron density may be performed to the formed protective film 107. Instead of the CVD method, plasma nitridation with a low electron temperature and a high electron density may be performed to form the protective film 107.

In one feature of this embodiment mode as described above, plasma treatment with a low electron temperature and a high electron density is performed to the semiconductor film 103 containing amorphous silicon so as to form a gate insulating film of a thin film transistor. In the case of this embodiment mode, attention needs to be paid to that the semiconductor film 103 becomes thin after performing the plasma treatment. In the gate insulating film of this embodiment mode, plasma damages and generation of cracks are suppressed, and heat treatment at a high temperature as in the thermal oxidation method is not required. Therefore, the gate insulating film can be formed at a temperature which does not affect a glass substrate.

Embodiment Mode 2

In Embodiment Mode 2, a high-density plasma treatment apparatus as shown in FIGS. 2A and 2B is used, and a protective film is formed by performing plasma treatment to a gate electrode of a thin film transistor.

Figure 3A:
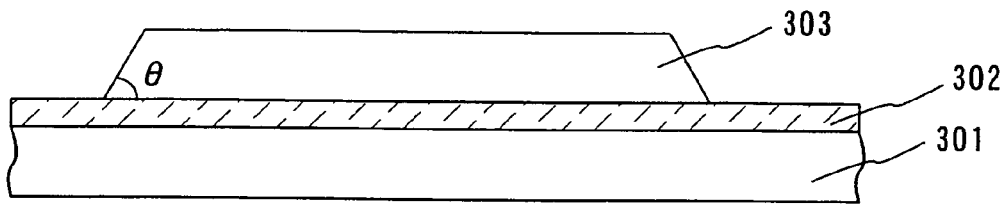
FIGS. 3A to 3D are cross-sections showing a manufacturing process of a thin film transistor corresponding to Embodiment Mode 2.

Similarly to Embodiment Mode 1, a base insulating film 302 is formed over a glass substrate 301, and a semiconductor film 303 containing amorphous silicon is formed thereover with a predetermined pattern (see FIG. 3A). Note that in this embodiment mode, when a predetermined pattern is formed, a tapered shape is formed to have an angle θ in the range of 30° to 60°. Then, in later forming a gate insulating film by a CVD method or the like, superior step coverage can be obtained as compared the case where an angle θ is in the range of 85° to 100°. In addition, in this embodiment mode also, a heat-resistant plastic substrate can be used, instead of using a glass substrate.

Figure 3B:
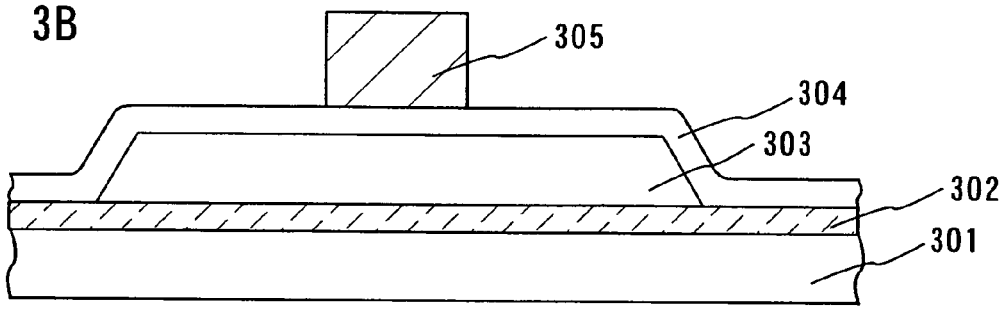

A gate insulating film 304 is formed over the semiconductor film 303 (see FIG. 3B). The gate insulating film 304 is formed of a silicon oxide film containing nitrogen (silicon oxynitride film), a silicon nitride film containing oxygen, a silicon nitride film, or a silicon oxide film by a plasma CVD method or the like. Further, by performing plasma nitridation or plasma oxidation, a nitride layer or an oxide layer can be formed over a surface of the film which has been formed by a plasma CVD method or the like. Alternatively, the gate insulating film 304 may be formed by plasma treatment by the method described in Embodiment Mode 1, instead of using a CVD method.

A gate electrode 305 shown in FIG. 3B and a wire pulled from the gate electrode 305 are formed over the gate insulating film 304. A high melting point metal film such as molybdenum, tungsten, or tantalum having a melting point of 2000° C. or more is formed by a sputtering method and formed into a wire shape in a photolithography step; accordingly, the gate electrode 305 is formed together with the wire pulled from the gate electrode 305. Instead of the sputtering method, a method which does not require a photolithography step, for example, a droplet discharge (inkjet) method may be used. The gate electrode 305 and the wire pulled from the gate electrode 305 may be formed into a tapered shape, and a stack structure including two or more layers may be employed.

Figure 3C:
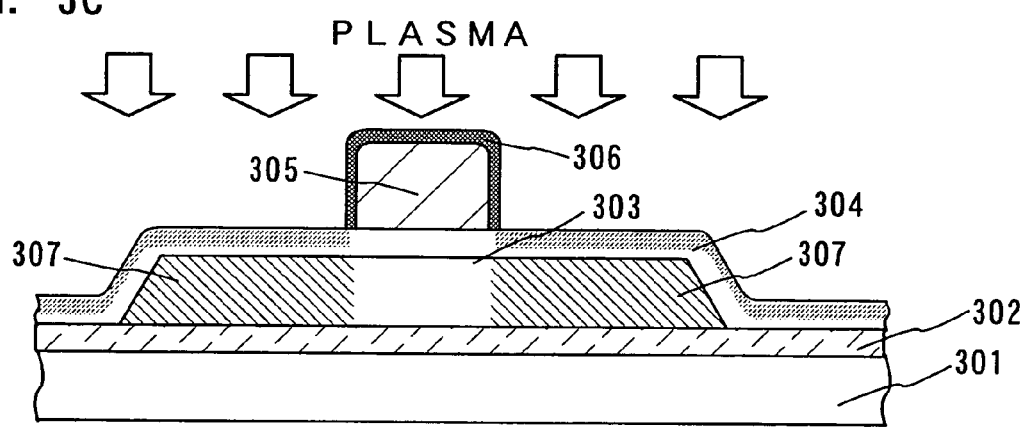

Plasma nitridation is performed to the gate electrode 305 and the wire pulled from the gate electrode 305 in the second plasma treatment chamber 202 of the high-density plasma treatment apparatus shown in FIG. 2A so as to form a metal nitride (molybdenum nitride, tungsten nitride, tantalum nitride, or the like) over surfaces of the gate electrode 305 and the wire pulled from the gate electrode 305. This metal nitride is to be a protective film 306 (see FIG. 3C). In a case where the protective film 306 does not have insulating properties but has conducting properties, the protective film 306 can be regarded as a part of the gate electrode 305. At this time, as apparently shown in FIG. 3C, a part of the gate insulating film 304, which is not covered by the gate electrode 305, is also subjected to plasma treatment. The protective film 306 contains a predetermined concentration of a rare gas which has been introduced into the second plasma treatment chamber 202. The part of the gate insulating film 304, which is not covered by the gate electrode 305 also contains the rare gas. Instead of the above-described plasma nitridation, plasma oxidation described in Embodiment Mode 1 may be performed as well, to form the protective film 306.

In this embodiment mode, microwaves having a frequency of 2.45 GHz are used in plasma nitridation, and nitrogen and argon are used as the gas introduced into the second plasma treatment chamber 202. A temperature of the heater provided under the substrate holder 211 is kept at 400° C. For example, a nitrogen flow is set in the range of 20 sccm to 2000 sccm, and an argon flow is set in the range of 100 sccm to 10000 sccm. A pressure in the second plasma treatment chamber 202 is set at an appropriate value in the range of 5 Pa to 500 Pa. Hydrogen may be further added into the nitrogen and argon, a gas made of a nitrogen compound such as ammonia may be substituted for the nitrogen, and another rare gas may be substituted for the argon. In the case where a heat-resistant plastic substrate is used instead of the glass substrate 301, a temperature of the heater provided under the substrate holder 211 is kept at 250° C.

Since plasma over the gate electrode 305 and the wire pulled from the gate electrode 305 has an electron temperature of 1.5 eV or less and an electron density of $1 \times 10^{11}$ cm$^{-3}$ or more, plasma damages to the protective film 306 obtained by plasma nitridation are suppressed.

The protective film 306 of this embodiment mode is formed to cover entire top and side surfaces of the gate electrode 305 and the wire pulled from the gate electrode 305. As a method of forming a protective film over entire top and side surfaces of a gate electrode, a method using anodic oxidation can be given as an example. However, since not one thin film transistor but a plurality of thin film transistors is formed, it is necessary that all gate electrodes be connected such that each has the same electric potential in anodic oxidation, and a step of dividing into each gate electrode of a thin film transistor is required after the anodic oxidation. On the other hand, in the case of forming the protective film by plasma treatment, such a dividing step is not required. In addition, a material capable of being subjected to the anodic oxidation is limited to aluminum, tantalum, or the like.

Subsequently, the semiconductor film 303 is doped with impurities imparting p-type conductivity or impurities imparting n-type conductivity and the impurities are activated, to form an impurity region 307 including a source region and a drain region. This doping step may be performed before forming the protective film 306 and after forming the gate electrode 305 and the wire pulled from the gate electrode 305. Further, a second doping may be performed after forming the protective film 306. The impurity region 307 may include an LDD region in addition to the source region and the drain region. In addition, the LDD region may be formed to overlap the gate electrode 305.

Figure 3D:
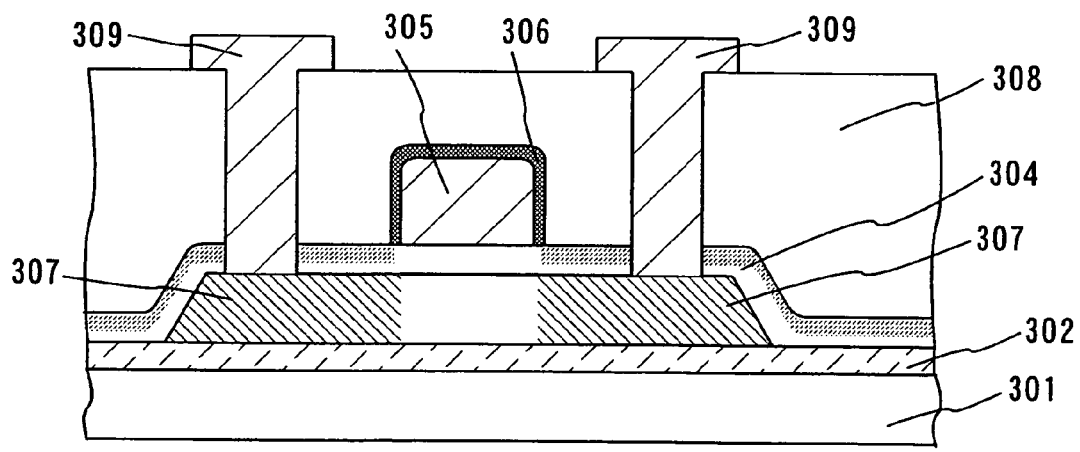

In this embodiment mode, since the protective film 306 is formed by plasma treatment, it is not necessary to form a film of, for example, silicon nitride or silicon nitride containing oxygen by a plasma CVD method or the like so as to form the protective film 306. Accordingly, after forming the protective film 306, as shown in FIG. 3D, an interlayer insulating film 308 is formed to cover the gate electrode 305 and the wire pulled from the gate electrode 305, contact holes exposing the source region and the drain region are formed in the gate insulating film 304 and the interlayer insulating film 308, and wires 309 are formed to fill these contact holes and over the interlayer insulating film 308.

The wires 309 may have a stack structure including two or more layers. For example, three layers of a first titanium film, an aluminum film, and a second titanium film are sequentially formed by a sputtering method or the like. Further, plasma nitridation with a low electron temperature and a high electron density described in this embodiment mode may be performed to the first titanium film to form a titanium nitride layer over a surface of the first titanium film. It is preferable to sequentially perform formation of the first titanium film, plasma nitridation, and formation of the aluminum film and the second titanium film without exposing to air. By forming films containing a metal as its main constituent such as chromium, molybdenum, or tungsten which has a higher melting point than that of aluminum, instead of forming the first and the second titanium films to interpose the aluminum film therebetween, a problem caused by low heat resistance of aluminum can be solved as in the case of using the first and the second titanium films.

In this embodiment mode, before forming the gate insulating film 304, plasma oxidation or plasma nitridation may be performed to an edge portion of the semiconductor film 303 with the high-density plasma treatment apparatus as shown in FIGS. 2A and 2B. In the case where the semiconductor film 303 has a tapered shape as in this embodiment mode, not only the impurity region 307 but also an edge portion of a channel formation region, which overlaps the gate electrode 305, of the semiconductor film 303 actually has a tapered shape, although not shown in FIGS. 3C and 3D. Accordingly, due to this reason, a thin film transistor which uses the semiconductor film 303 sometimes shows different characteristics from that in the case where the semiconductor film does not have a tapered shape. Such a thin film transistor is called a parasitic transistor, and the parasitic transistor can be prevented from being formed, by performing plasma oxidation or plasma nitridation to the edge portion (tapered portion) of the semiconductor film 303 and forming silicon oxide or silicon nitride thereover.

This embodiment mode can be carried out in combination with Embodiment Mode 1.

Embodiment Mode 3

In Embodiment Mode 3, plasma treatment is performed to an insulating film (gate insulating film) formed by a plasma CVD or the like, with the high-density plasma treatment apparatus as shown in FIGS. 2A and 2B. Thus, a surface of this insulating film formed by a plasma CVD or the like is modified to increase the quality of the gate insulating film.

Figure 4A:
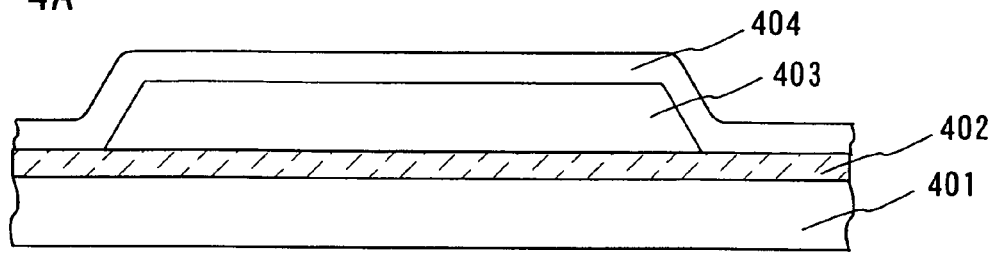
FIGS. 4A to 4D are cross-sections showing a manufacturing process of a thin film transistor corresponding to Embodiment Mode 3.

Similarly to Embodiment Mode 2, a base insulating film 402 is formed over a glass substrate 401, and a semiconductor film 403 containing amorphous silicon is formed thereover with a predetermined pattern (see FIG. 4A). In this embodiment mode also, a heat-resistant plastic substrate can be used instead of using the glass substrate.

An insulating film 404 is formed over the semiconductor film 403 by a plasma CVD method or the like. In this embodiment mode, a silicon oxide film containing nitrogen (silicon oxynitride film) is formed as the insulating film 404. Instead of the silicon oxide film containing nitrogen, a silicon nitride film containing oxygen, a silicon oxide film, or a silicon nitride film may be formed by a CVD method or the like.

Figure 4B:
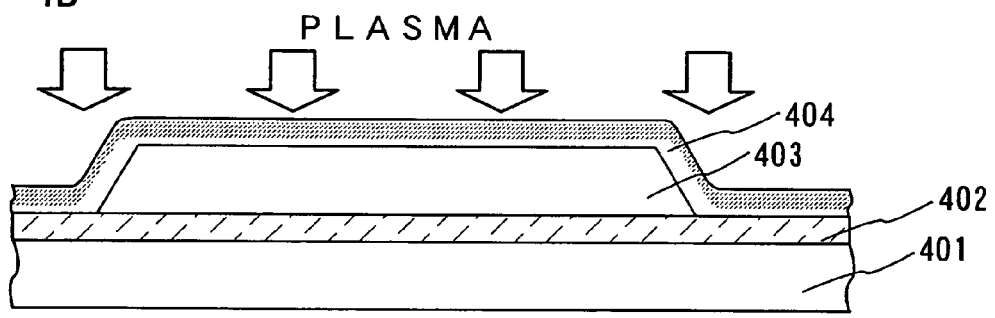

Plasma nitridation is performed to the formed insulating film 404 in the second plasma treatment chamber 202 of the high-density plasma treatment apparatus shown in FIG. 2A. The insulating film 404 contains a predetermined concentration of a rare gas which has been introduced into the second plasma treatment chamber 202. The insulating film 404 subjected to plasma nitridation is used as a gate insulating film (see FIG. 4B).

In this embodiment mode, microwaves having a frequency of 2.45 GHz are used in plasma nitridation, and nitrogen and argon are used as the gas introduced into the second plasma treatment chamber 202. A temperature of the heater provided under the substrate holder 211 is kept at 400° C. The nitrogen and argon flows are set in the range described in Embodiment Mode 2. Hydrogen may be further added into the nitrogen and argon, a gas made of a nitrogen compound such as ammonia may be substituted for the nitrogen, and another rare gas may be substituted for the argon. In the case where a heat-resistant plastic substrate is used instead of the glass substrate 401, a temperature of the heater provided under the substrate holder 211 is kept at 250° C., for example. Plasma over the insulating film 404 has an electron temperature of 1.5 eV or less and an electron density of $1 \times 10^{11}$ cm$^{-3}$ or more.

Instead of plasma nitridation, plasma oxidation may be performed in the first plasma treatment chamber 201 of the high-density plasma treatment apparatus shown in FIG. 2A.

Figure 5A:
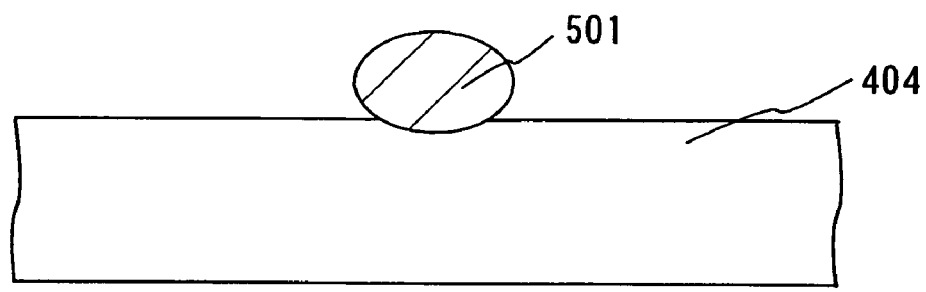
FIGS. 5A and 5B are cross-sections showing plasma treatment performed to an insulating film to which a dust is attached.

There is a case where dust is attached to a film which is formed by a CVD method or a sputtering method. Although various shapes of this dust can be considered, a state where granular dust 501 formed from an inorganic substance is attached to a surface of the insulating film 404 is shown in FIG. 5A. A case where plasma nitridation or plasma oxidation is performed to the insulating film 404 on which the dust 501 is attached is considered in accordance with this embodiment mode. Note that the above-mentioned dust is also called a particle, and a film formed by a CVD method, a sputtering method, or the like is required to have as little particles as possible.

Figure 5B:
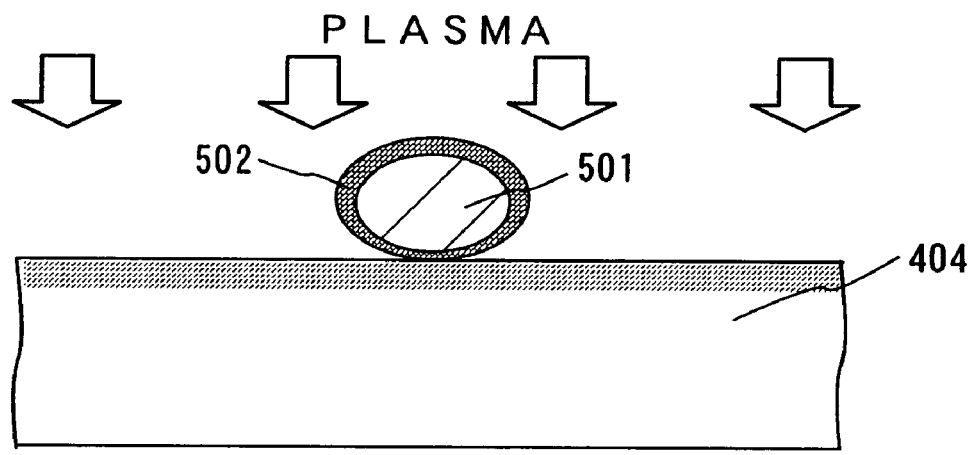

By the plasma oxidation or plasma nitridation, oxidation or nitridation proceeds to a portion under the dust 501, as well as a portion on which a dust does not exist (see FIG. 5B). A thickness of the insulating film 404 increases by the plasma oxidation or plasma nitridation, and a thickness of the portion under the dust 501 similarly increases as well. In addition, at least a surface portion 502 of the dust 501 is oxidized or nitrided. As a result, a volume of the dust 501 is increased. Note that when the insulating film 404 and the dust 501 are formed of a nitride and plasma nitridation is performed thereto, or when the insulating film 404 and the dust 501 are formed of an oxide and plasma oxidation is performed thereto, a volume of the dust 501 does not increase and a surface of the insulating film 404 is not nitrided or oxidized.

When the thickness of the insulating film 404 and the volume of the dust 501 are increased, as shown in FIG. 5B, a state in which the dust 501 can be easily removed from the surface of the oxidized or nitrided insulating film 404 by a simple cleaning method such as brush cleaning or megasonic cleaning can be obtained. Thus, even a dust with a size of several nanometers can become easy to be removed by plasma oxidation or plasma nitridation. This can be said not only in this embodiment mode, and the same can be said for other embodiment modes in the case where plasma treatment is performed to a gate electrode or a semiconductor film to which dust (particle) is attached.

The above explanation is for the case where the dust (particle) is formed from an inorganic substance; however, in the case where the dust is formed from an organic substance, ashing is performed by plasma oxidation and the dust can be removed without separately performing cleaning.

Figure 4C:
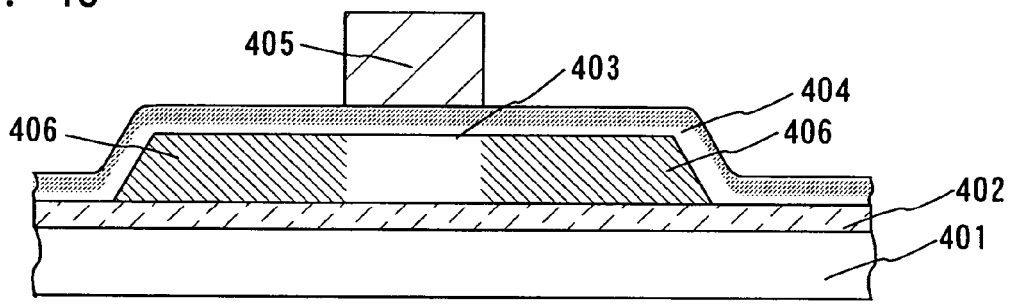

After performing the plasma treatment to the insulating film 404, a gate electrode 405 and a wire pulled from the gate electrode 405 are formed as shown in FIG. 4C. The gate electrode 405 and the wire pulled from the gate electrode 405 may have a tapered shape, and a stack structure including two or more layers may be employed. Subsequently, the semiconductor film 403 is doped with impurities imparting p-type conductivity or impurities imparting n-type conductivity and the impurities are activated, to form an impurity region 406 including a source region and a drain region. The impurity region 406 may include an LDD region in addition to the source region and the drain region. In addition, the LDD region may be formed to overlap the gate electrode 405.

Figure 4D:
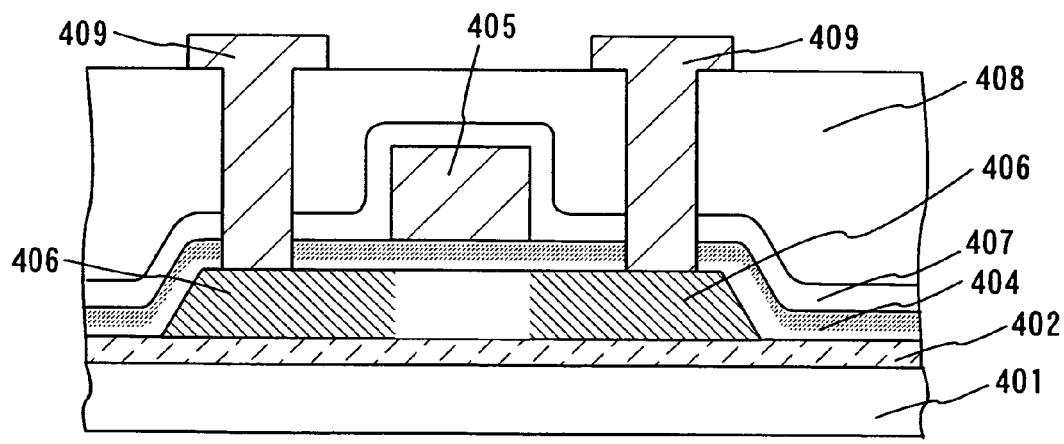

A protective film 407 and an interlayer insulating film 408 are formed to cover the gate electrode 405 and the wire pulled from the gate electrode 405, contact holes exposing the source region and the drain region are formed in the insulating film 404, the protective film 407, and the interlayer insulating film 408. Then, wires 409 are formed to fill these contact holes and over the interlayer insulating film 408 (see FIG. 4D). In forming the protective film 407, a silicon nitride film or a silicon nitride film containing oxygen is formed by a plasma CVD method or the like. Plasma treatment with a low electron temperature and a high electron density can be performed to the formed protective film 407. As the protective film 407, a silicon oxide film is formed by a plasma CVD method or the like, and plasma nitridation with a low electron temperature and a high electron density may be performed thereto. The protective film 407 may be formed by plasma nitridation with a low electron temperature and a high electron density as in Embodiment Mode 2, instead of using a CVD method.

In this embodiment mode, when the semiconductor film 403 has a tapered shape as shown in FIG. 4A, an edge portion (tapered portion) of the semiconductor film 403 may be subjected to plasma oxidation or plasma nitridation before forming the gate insulating film 404.

This embodiment mode can be carried out in combination with either or both of Embodiment Mode 1 and Embodiment Mode 2.

Embodiment Mode 4

In Embodiment Mode 4, an example of performing plasma nitridation or plasma oxidation with the high-density plasma treatment apparatus as shown in FIGS. 2A and 2B in a manufacturing process of a bottom-gate thin film transistor will be described.

Figure 6A:
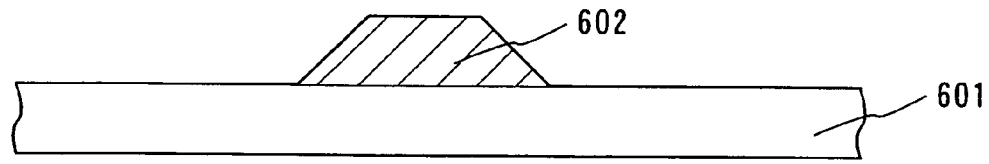
FIGS. 6A to 6D are cross-sections showing a manufacturing process of a thin film transistor corresponding to Embodiment Mode 4.

As shown in FIG. 6A, a gate electrode 602 and a wire pulled from the gate electrode 602 are formed over a glass substrate 601. In addition, a high melting point metal film such as molybdenum, tungsten, or tantalum having a melting point of 2000° C. or more is formed by a sputtering method and formed into a wire shape in a photolithography step; accordingly, the gate electrode 602 is formed together with the wire pulled from the gate electrode 602. Instead of the sputtering method, a method which does not require a photolithography step, for example, a droplet discharge (inkjet) method may be used. A heat-resistant plastic substrate may be used instead of the glass substrate. In this embodiment mode, the gate electrode 602 and the wire pulled from the gate electrode 602 may be formed into a tapered shape as shown in FIG. 6A; however, those are not necessarily formed into a tapered shape.

In addition, the gate electrode 602 and the wire pulled from the gate electrode 602 may be formed in such a manner as described in Embodiment Mode 2, and a stack structure including two or more layers may be employed.

Plasma oxidation is performed to the gate electrode 602 and the wire pulled from the gate electrode 602 in the first plasma treatment chamber 201 of the high-density plasma treatment apparatus shown in FIG. 2A so as to form a metal oxide (molybdenum oxide, tungsten oxide, tantalum oxide, or the like) over surfaces of the gate electrode 602 and the wire pulled from the gate electrode 602. This metal oxide is shown as a first protective film 603 in FIG. 6B. At the same time, as is apparently shown in FIG. 6B, the glass substrate 601 is also subjected to plasma treatment. The oxide film and the glass substrate 601 contain a predetermined concentration of a rare gas which has been introduced into the first plasma treatment chamber 201.

Figure 6B:
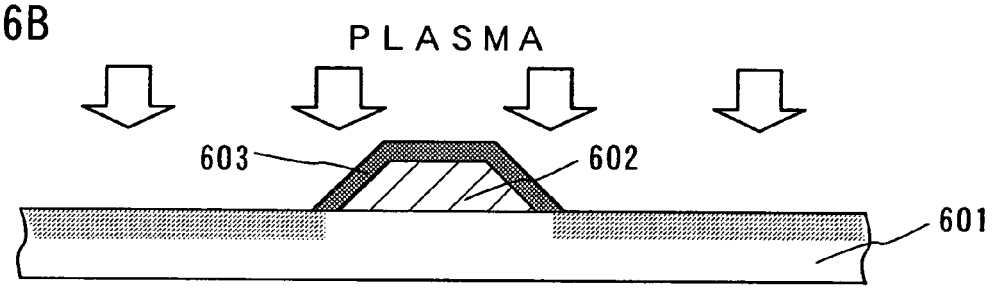

In plasma oxidation of this embodiment mode, plasma is generated using microwaves having a frequency of 2.45 GHz, and oxygen, hydrogen, and argon are introduced into the first plasma treatment chamber 201 with a flow ratio of $O_2:H_2:Ar=1:1:100$, for example. The flows of oxygen, hydrogen, and argon are set in the range described in Embodiment Mode 1. Plasma oxidation can be performed without introducing hydrogen, similarly to Embodiment Mode 1. Instead of the argon, another rare gas may be introduced. A pressure in the first plasma treatment chamber 201 is set at an appropriate value in the range of 5 Pa to 500 Pa. The glass substrate 601 is provided on the substrate holder 211 of the first plasma treatment chamber 201, and a temperature of the heater provided under the substrate holder 211 is kept at 400° C. Then, plasma oxidation is performed to the gate electrode 602 and the wire pulled from the gate electrode 602 over the glass substrate 601. As a result, the first protective film 603 shown in FIG. 6B is formed. In the case where a heat-resistant plastic substrate is used instead of the glass substrate 601, a temperature of the heater provided under the substrate holder 211 is kept at, for example, 250° C.

Since plasma over the gate electrode 602 and the wire pulled from the gate electrode 602 has an electron temperature of 1.5 eV or less and an electron density of $1\times10^{11}$ cm$^{-3}$ or more, plasma damages to the oxide film obtained by plasma oxidation are suppressed.

The first protective film 603 of this embodiment mode is formed to cover entire top and side surfaces of the gate electrode 602 and the wire pulled from the gate electrode 602. As a method of forming a protective film over entire top and side surfaces of a gate electrode, a method using anodic oxidation is known. However, since not one thin film transistor but a plurality of thin film transistors is formed, it is necessary that all gate electrodes be connected such that each has the same electric potential in anodic oxidation, and a step of dividing into each gate electrode of a thin film transistor is required after the anodic oxidation. On the other hand, in the case of forming the oxide film by plasma treatment, such a dividing step is not required.

Instead of plasma oxidation, plasma nitridation may be performed by the method described in Embodiment Mode 2 to form the first protective film 603. In that case, a metal nitride (molybdenum nitride, tungsten nitride, tantalum nitride, or the like) is formed. Plasma nitridation may be continuously performed after plasma oxidation, or plasma oxidation may be continuously performed after plasma nitridation as well.

When the first protective film 603 is an insulating film of molybdenum oxide, tungsten oxide, tantalum oxide, or the like, the first protective film 603 can be a part of the gate insulating film.

Figure 6C:
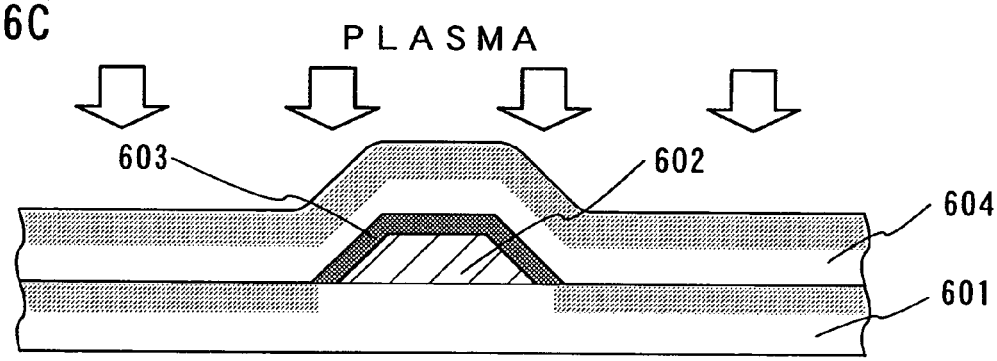

An insulating film 604 is formed over the first protective film 603 and the glass substrate 601 by a plasma CVD method or the like (see FIG. 6C). In this embodiment mode, a silicon oxide film containing nitrogen (silicon oxynitride film) is formed as the insulating film 604. Instead of the silicon oxide film containing nitrogen, a silicon nitride film, a silicon nitride film containing oxygen, or a silicon oxide film may be formed by a CVD method or the like.

Plasma nitridation is performed to the insulating film 604 in the second plasma treatment chamber 202 of the high-density plasma treatment apparatus shown in FIG. 2A. The insulating film 604 subjected to plasma nitridation is used as a gate insulating film.

In plasma nitridation of this embodiment mode, microwaves having a frequency of 2.45 GHz are used, nitrogen and argon are used as a gas introduced into the second plasma treatment chamber 202, and a temperature of the heater provided under the substrate holder 211 is kept at 400° C. The flows of nitrogen and argon are set in the range described in Embodiment Mode 2. Hydrogen may be further added to the nitrogen and argon, ammonia may be substituted for the nitrogen, and another rare gas may be substituted for the argon. In the case where a heat-resistant plastic substrate is used instead of the glass substrate 601, a temperature of the heater provided under the substrate holder 211 is kept at 250° C. The plasma over the insulating film 604 has an electron temperature of 1.5 eV or less and an electron density of $1\times10^{11}$ cm$^{-3}$ or more.

Instead of plasma nitridation, plasma oxidation may be performed in the first plasma treatment chamber 201 of the high-density plasma treatment apparatus shown in FIG. 2A.

Figure 6D:
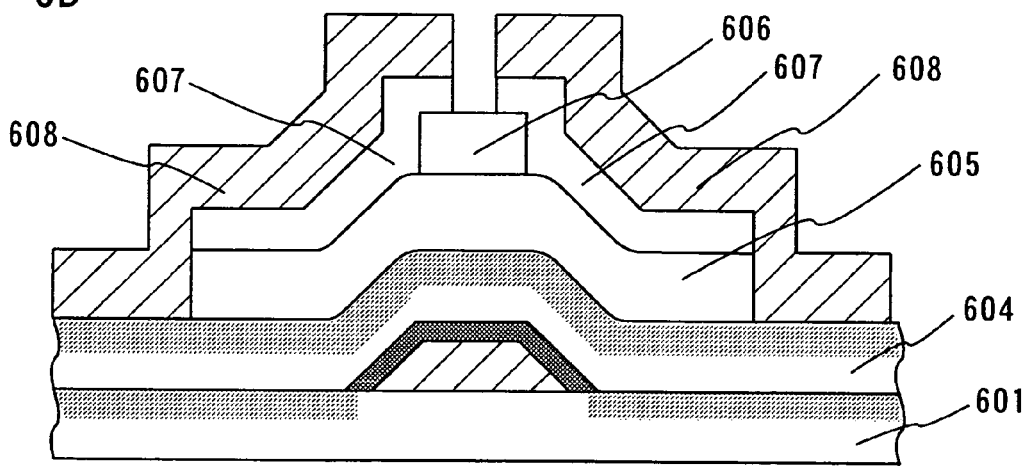

Then, as shown in FIG. 6D for example, a first semiconductor film 605 containing amorphous silicon, a second protective film 606, a second semiconductor film 607 doped with impurities imparting n-type conductivity (such as phosphorus), and a wire 608 are formed with a predetermined shape by a known method. The impurities such as phosphorus contained in the second semiconductor film 607 are activated if necessary. The second protective film 606 is usually called a channel protective film.

The bottom-gate thin film transistor manufactured in this embodiment mode is not limited to the structure shown in FIG. 6D. A bottom-gate thin film transistor having another structure such as a channel-etched thin film transistor without a channel protective film may also be used.

Described above is the example of performing plasma treatment with a low electron temperature and a high electron density to both the gate electrode 602 and the wire pulled from the gate electrode 602, and the insulating film 604. However, the plasma treatment with a low electron temperature and a high electron density may be performed to either one of them. In addition, when the first protective film 603 sufficiently functions as a gate insulating film, the first protective film 603 may be used as a gate insulating film without providing the insulating film 604.

Embodiment Mode 5

Embodiment Mode 5 describes an example of performing plasma treatment to a protective film after forming the protective film. The protective film corresponds to the protective film 107 shown in Embodiment Mode 1 and FIG. 1D or the protective film 407 shown in Embodiment Mode 3 and FIG. 4D.

Figure 7A:
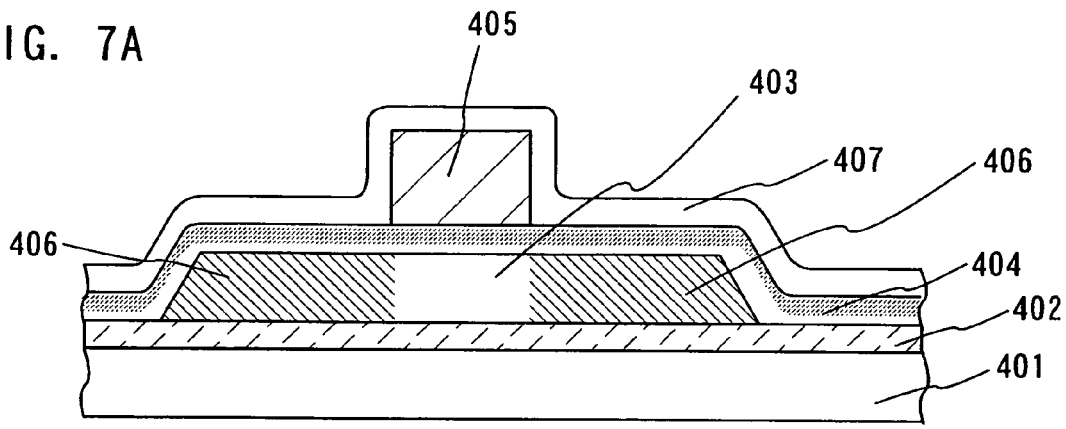
FIGS. 7A to 7C are cross-sections showing a manufacturing process of a thin film transistor corresponding to Embodiment Mode 5.

A process up to forming the protective film may follow Embodiment Mode 1 or Embodiment Mode 3. Alternatively, the plasma treatment to the insulating film 404 carried out in Embodiment Mode 3 may be skipped and a process up to forming the protective film 404 may be performed. FIG. 7A shows a state, in which the protective film 407 is formed by following Embodiment Mode 3, in other words, through plasma treatment to the insulating film 404. In this embodiment mode, a silicon nitride film, a silicon nitride film containing oxygen, or a silicon oxide film formed by a plasma CVD method or the like is used as the protective film 407. The reference numerals 401 to 407 shown in FIG. 7A commonly denote the same components in Embodiment Mode 3.

Figure 7B:
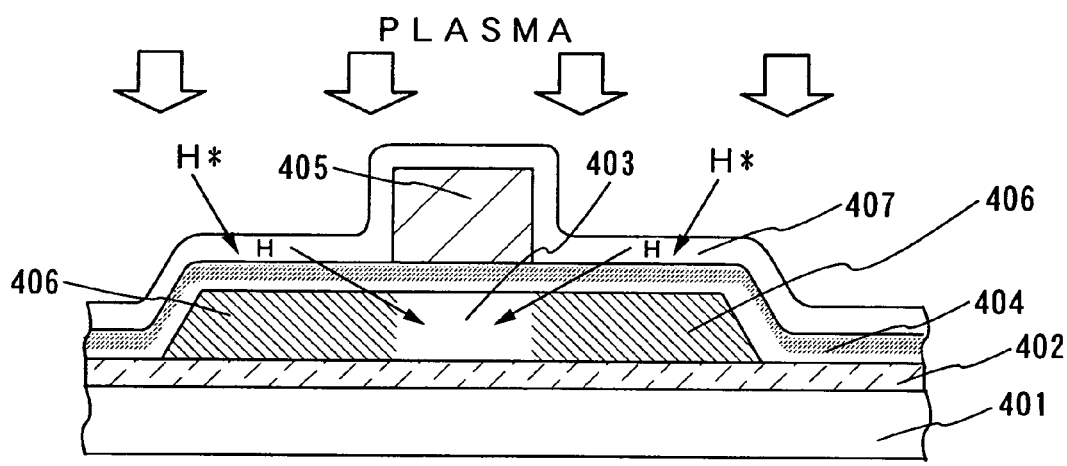

Next, as shown in FIG. 7B, after forming the protective film 407, plasma treatment is performed in the second plasma treatment chamber 202 of the high-density plasma treatment apparatus shown in FIG. 2A. In the plasma treatment, microwaves having a frequency of 2.45 GHz are used, and hydrogen and a rare gas are used as the gas introduced into the second plasma treatment chamber 202. A temperature of the heater provided under the substrate holder 211 is kept at 350° C. or more and 450° C. or less. As the rare gas, argon is used in this embodiment mode. For example, a hydrogen flow is set in the range of 20 sccm to 2000 sccm, and an argon flow is set in the range of 100 sccm to 10000 sccm. The plasma over the protective film 407 has an electron temperature of 1.5 eV or less and an electron density of $1\times10^{11}$ cm$^{-3}$ or more. Reference character, "H*" shown in FIG. 7B means a hydrogen radical.

Since hydrogen is used as the introduction gas as described above, the protective film 407 after the plasma treatment contains hydrogen. Since the glass substrate 401 is heated in the plasma treatment, hydrogen in the protective film 407 diffuses into the semiconductor film 403 containing amorphous silicon through the insulating film 404 to hydrogenate the semiconductor film 403. Hydrogen is also diffused into a channel formation region below the gate electrode 405 as shown in FIG. 7B. After the plasma treatment, the glass substrate 401 may be heated for a predetermine time with a temperature of 350° C. or more and 400° C. or less in an atmosphere containing hydrogen so as to further hydrogenate the semiconductor film 403.

In addition, as the gas introduced into the second plasma treatment chamber 202, ammonia (NH$_3$) can be added to the hydrogen and argon, or ammonia can be substituted for the hydrogen. In this case, hydrogen is introduced from a surface of the protective film 407, the semiconductor film 403 can be hydrogenated, and plasma nitridation can also be performed to the protective film 407. When the protective film 407 is a silicon nitride film containing oxygen, at least a surface of the protective film 407 is nitrided. When the protective film 407 is a silicon oxide film, at least a surface of the protective film 407 is nitrided to form silicon oxynitride. When the protective film 407 is a silicon nitride film, densification thereof can be achieved.

In addition, when hydrogen is contained in the gas introduced to the first plasma treatment chamber 201 or the second plasma treatment chamber 202 in performing plasma treatment with a low electron temperature and a high plasma density to the insulating film 404, hydrogen is added to the insulating film 404. Then, the glass substrate 401 is heated at a temperature of the heater provided under the substrate holder 211 of 350° C. or more and 450° C. or lower to diffuse the added hydrogen into the semiconductor film 403, and the semiconductor film 403 can be hydrogenated. In addition, nitridation and oxidation may be prevented from being performed in plasma treatment by using only hydrogen and a rare gas as the introduction gas.

Figure 7C:
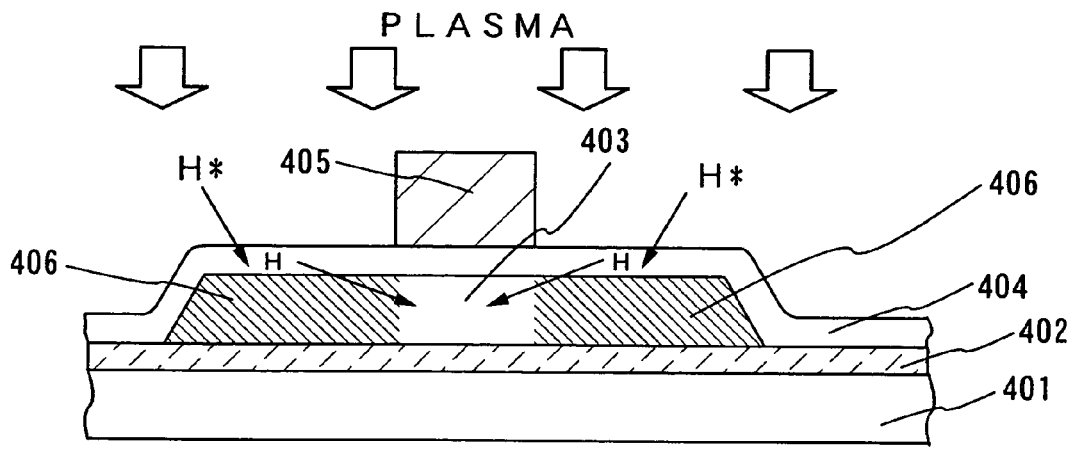

In the case where the semiconductor film 403 is doped and activated after hydrogenating the semiconductor film 403, when the activation is performed at a temperature of 500° C. or more, hydrogen is removed from the semiconductor film 403. Accordingly, an order should be changed as follows: the insulating film 404 and the gate electrode 405 are formed, doping and activation at a temperature of 500° C. or more are performed to the semiconductor film 403, and then the semiconductor film 403 is hydrogenated by the plasma treatment as shown in FIG. 7C. Reference character, "H*" shown in FIG. 7C means a hydrogen radical. After that, the glass substrate 401 may be heated at a temperature of 350° C. or more and 400° C. or less for a predetermined time in an atmosphere containing hydrogen so as to further hydrogenate the semiconductor film 403.

Hydrogenation in this embodiment mode can be carried out in combination with other embodiment modes.

Embodiment Mode 6

In Embodiment Mode 6, an example of performing plasma nitridation to a glass substrate with the high-density plasma treatment apparatus as shown in FIGS. 2A and 2B will be described.

The glass substrate used in Embodiment Modes 1 to 5 is typically a non-alkali glass. The non-alkali glass contains silicon oxide as its main component and contains boron oxide, aluminum oxide, and an oxide of an alkaline earth metal. By performing plasma nitridation to such a non-alkali glass, a nitride layer containing silicon nitride or silicon nitride containing oxygen as its main component can be formed over a surface thereof.

Accordingly, when performing plasma nitridation to the glass substrate with a low electron temperature and a high electron density in Embodiment Mode 1, 2, 3, or 5, a silicon nitride film or a silicon nitride film containing oxygen is not necessarily formed by a CVD method or the like as a base insulating film. In addition, plasma damages can be suppressed more and a denser nitride film can be formed than in the case of forming the silicon nitride film or the silicon nitride film containing oxygen by a CVD method.

Embodiment Mode 7

In Embodiment Mode 7, an example of employing a multigate structure as a structure of a thin film transistor will be described. The multigate structure is a structure in which two or more thin film transistors having standard structures (single-gate structure) shown in FIG. 1D or the like are connected in series and in which gate electrodes of the respective thin film transistors are connected to each other. It is known that off current can be reduced by employing the multigate structure, compared with the case of the single-gate structure.

The plasma treatment described in Embodiment Modes 1 to 6 can be applied to a manufacturing process of a thin film transistor having a multigate structure. The similar effect to that in the case of the thin film transistor having a single-gate structure can be obtained, by performing plasma oxidation or plasma nitridation with a low electron temperature and a high electron density in manufacturing the thin film transistor having a multigate structure.

Embodiment Mode 8

Oxidation characteristics in performing plasma oxidation to a treatment subject with the above-described high-density plasma treatment apparatus will be described. Specifically, changes in oxidative rates due to a difference of gases used in the plasma oxidation will be described.

First, a silicon oxynitride film ($SiO_xN_y$ film, note that x>y) is formed with a thickness of about 100 nm as a base insulating film over a glass substrate by a CVD method, and an amorphous silicon film is formed with a thickness of about 66 nm over the base insulating film by a CVD method. Next, heat treatment is performed to remove hydrogen contained in the amorphous silicon film, and then, the amorphous silicon film is crystallized by laser light irradiation to form a crystalline silicon film. Subsequently, plasma oxidation is performed to the crystalline silicon film with the high-density plasma treatment apparatus. In plasma oxidation, the glass substrate is set on a substrate holder, and a temperature of a heater provided under the substrate holder is set at 400° C.

In this embodiment mode, plasma oxidation is performed with flows of argon and oxygen set at 500 sccm and 5 sccm respectively (Condition 1), or with flows of argon, oxygen, and hydrogen set at 500 sccm, 5 sccm, and 5 sccm respectively (Condition 2). In Conditions 1 and 2, pressure is set at 133.33 Pa. The only difference between Conditions 1 and 2 is whether hydrogen is introduced or not.

Figure 11:
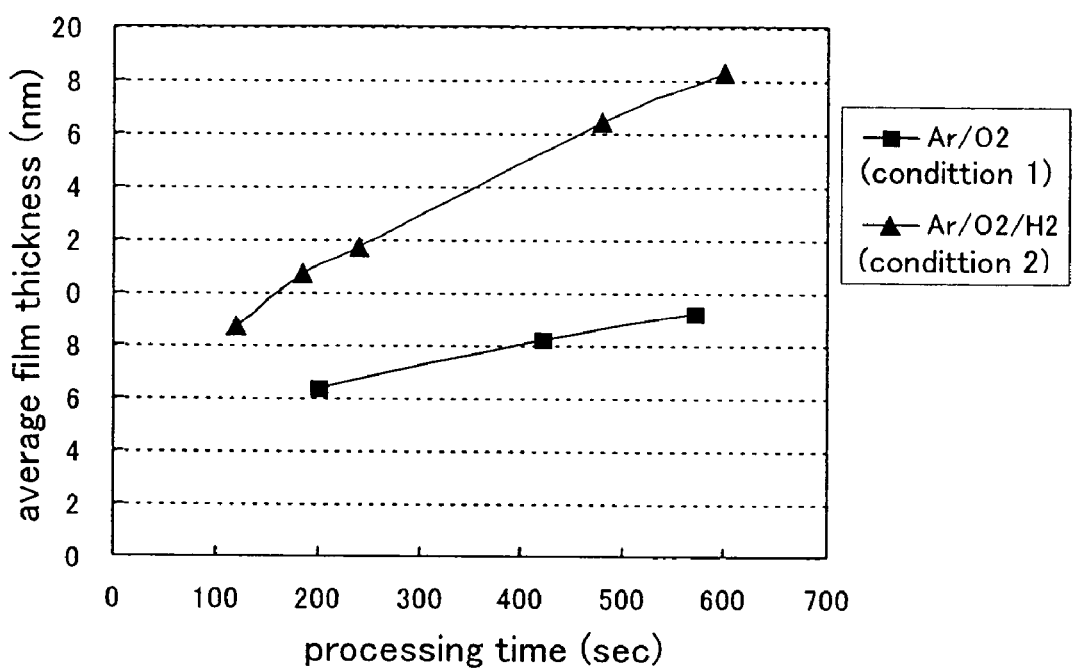
FIG. 11 shows changes in the average film thickness of a formed oxide film with respect to the plasma oxidation time corresponding to Embodiment Mode 8.

Oxidative rates of amorphous silicon films of Conditions 1 and 2 are shown in FIG. 11. Note that the horizontal axis shows the treating time (sec), and the vertical axis shows the average film thickness (nm) in FIG. 11. The treating time means time the plasma oxidation is performed to the amorphous silicon film. The average film thickness means a result of an average value which is obtained by measuring film thicknesses of 25 portions of an oxide film formed by oxidizing the amorphous silicon film by plasma oxidation.

In Conditions 1 and 2, as the treating time by the high-density plasma treatment apparatus is increased, oxidation of the amorphous silicon film proceeds, and an average film thickness of the oxide film formed on the amorphous silicon film is increased. In addition, comparing with the case where plasma oxidation is performed with Condition 1 which is the case where argon and oxygen are introduced, it is found that an average film thickness of the oxide film formed on the amorphous silicon film is thicker when plasma oxidation is performed with Condition 2 which is the case where hydrogen is added in Condition 1. In other words, it is found that by performing plasma oxidation with the condition of adding hydrogen, a treating time for forming an oxide film having a predetermined thickness can be reduced, and a thicker oxide film can be formed in the same treating time, compared with the condition without adding hydrogen.

Embodiment 1

As an example of using the thin film transistor manufactured in Embodiment Modes 1 to 7 in an active matrix display device, an EL (electroluminescence) display device including a light emitting element in a pixel portion is described.

Figure 8A:
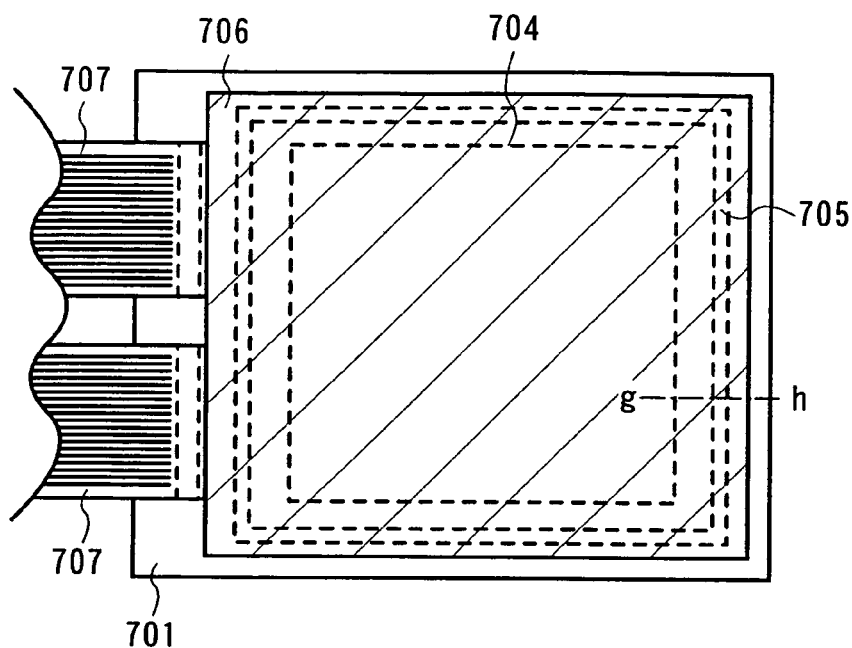
FIGS. 8A and 8B show an EL display device corresponding to Embodiment 1.
Figure 8B:
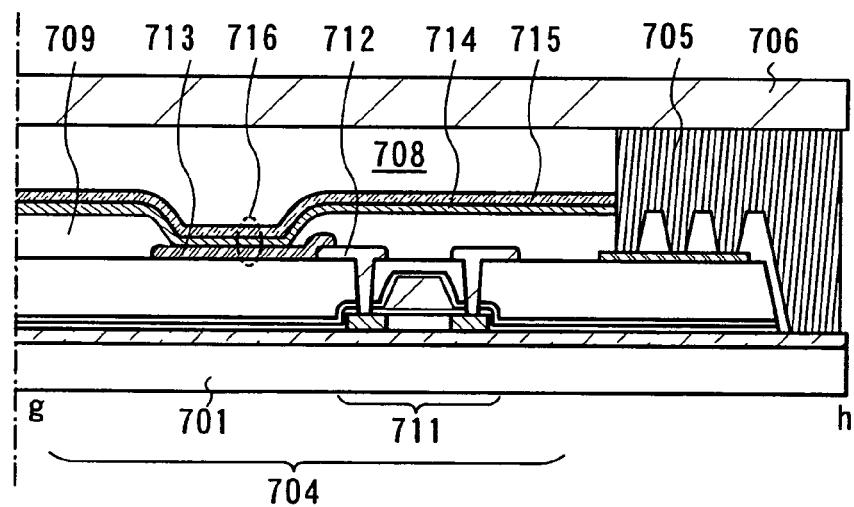

FIG. 8A is a top view showing an example of the active matrix display device, and FIG. 8B shows a cross-section of the EL display device, taken along line g-h of FIG. 8A.

As shown in FIG. 8A, the display device shown in this embodiment includes a pixel portion 704 provided over a substrate 701. In addition, an opposite substrate 706 is provided to face the substrate 701 so as to interpose the pixel portion 704 therebetween. The pixel portion 704 is provided with a thin film transistor having any structure described in Embodiment Modes 1 to 7 over the substrate 701. The substrate 701 and the opposite substrate 706 are attached with a sealing material 705. In addition, a driver circuit is provided outside the substrate 701 via an FPC (Flexible Printed Circuit) 707 in which a wire is formed of copper foil or the like.

The pixel portion 704 is formed of a plurality of pixels each of which includes a light emitting element 716 and a thin film transistor 711 for driving the light emitting element 716 shown in FIG. 8B. As the thin film transistor 711, the thin film transistor manufactured through any process shown in Embodiment Modes 1 to 7 can be employed.

In addition, in this embodiment, a first electrode 713 is provided to connect to a wire 712 which is connected to a source or drain region of the thin film transistor 711, and an insulating film 709 is formed to cover an edge portion of the first electrode 713. The insulating film 709 functions as a partition wall between the plurality of pixels.

The insulating film 709 is formed by using a positive photosensitive acrylic resin film. In addition, in order to obtain favorable coverage, the insulating film 709 is provided so as to form a curved surface having a curvature radius at an upper portion or a lower portion of the insulating film 709. For example, when a positive photosensitive acrylic is used as a material of the insulating film 709, it is preferable that only the upper portion of the insulating film 709 have a curved surface having a curvature radius (0.2 μm to 3 μm). As the insulating film 709, either of a negative type which is photosensitive and becomes insoluble in an etchant by light or a positive type which becomes soluble in an etchant by light can be used. In addition, as the insulating film 709, a single layer or a stack structure of an organic material such as epoxy, polyimide, polyamide, polyvinylphenol, or benzocyclobutene or a siloxane-based resin can be used. In addition, plasma treatment can be performed to the insulating film 709 to oxidize or nitride the insulating film 709; accordingly, a surface of the insulating film 709 is modified and a dense film can be obtained. By modifying the surface of the insulating film 709, strength of the insulating film 709 is improved, and physical damages can be reduced, such as generation of cracks in forming an opening portion or the like or film reduction in etching. In addition, by modifying the surface of the insulating film 709, interface properties such as attachment to a light emitting layer 714 provided over the insulating film 709 can be improved.

In the EL display device shown in FIGS. 8A and 8B, the light emitting layer 714 is formed over the first electrode 713, and a second electrode 715 is formed over the light emitting layer 714. A light emitting element 716 is formed of a stack structure of the first electrode 713, the light emitting layer 714, and the second electrode 715.

One of the first electrode 713 and the second electrode 715 is used as an anode, and the other is used as a cathode. In the case of being used as the anode, a material with a high work function is preferably used. For example, not only a single-layer film such as an ITO film, an indium tin oxide film containing silicon, a light-transmitting conductive film formed with a target in which zinc oxide (ZnO) is mixed with indium oxide by a sputtering method, zinc oxide (ZnO), a titanium nitride film, a chromium film, a tungsten film, a Zn film, or a Pt film, but also a stack of a titanium nitride film and a film containing aluminum as its main component, a three-layered structure of a titanium nitride film, a film containing aluminum as its main component, and a titanium nitride film can be used. Note that when employing a stack structure, resistance of a wire becomes low, favorable ohmic contact can be obtained, and further the stack structure can function as an anode. In the case of being used as the cathode, a material with a low work function (Al, Ag, Li, Ca, or an alloy thereof such as MgAg, MgIn, AlLi, $CaF_2$, or calcium nitride) is preferably used. Note that in a case of making the electrode used as the cathode have light transmitting properties, a stack of a metal thin film a thickness of which is thinned and a light-transmitting conductive film is preferably used as the electrode. As the light-transmitting conductive film, for example, ITO, indium tin oxide containing silicon, a light-transmitting conductive film formed with a target in which zinc oxide (ZnO) is mixed with indium oxide by a sputtering method, or zinc oxide (ZnO) can be used. Here, an ITO having light transmitting properties is used as the first electrode 713, and a structure in which light is extracted from a side of the substrate 701 is employed. Note that a structure in which light is extracted from a side of the opposite substrate 706 may be used by using a light transmitting material for the second electrode 715. Alternatively, a structure in which light is extracted from both sides of the substrate 701 and the opposite substrate 706 (dual emission) can be used as well by forming the first electrode 713 and the second electrode 715 with a light transmitting material.

In addition, the light emitting layer 714 can be formed of a single layer or a stack structure of a low molecular material, a middle molecular material (including oligomer and dendrimer), or a high molecular material by a known method such as a vapor-deposition method using a vapor-deposition mask, an inkjet method, or a spin coating method.

In addition, a structure is used, in which the light emitting element 716 of the invention is provided in a space 708 which is surrounded by the substrate 701, the opposite substrate 706, and the sealing material 705 by attaching the opposite substrate 706 and the substrate 701 with the sealing material 705. Note that a structure of filling the space 708 with the sealing material 705 can be also employed in addition to the case of filling the space 708 with an inert gas (such as nitrogen or argon).

Note that epoxy resin is preferably used as the sealing material 705. As a material used for the opposite substrate 706, a plastic substrate made from FRP (Fiberglass-Reinforced Plastics), PVF (polyvinyl fluoride), mylar, polyester, acryric, or the like can be used as well as a glass substrate or a quartz substrate.

Embodiment 2

As an example of using the thin film transistor manufactured in Embodiment Modes 1 to 7 in an active matrix display device, a liquid crystal display device in which a liquid crystal is used in a pixel portion is described.

Figure 9:
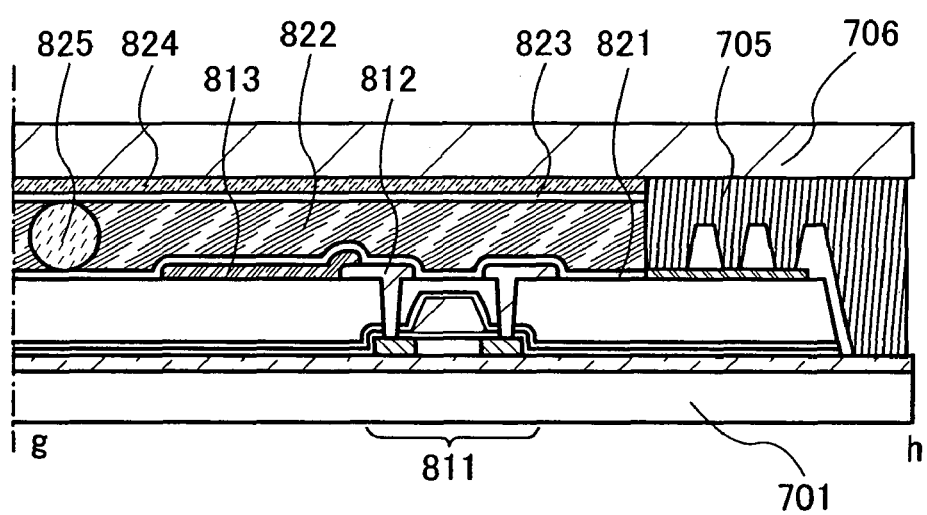
FIG. 9 shows a liquid crystal display device corresponding to Embodiment 2.

FIG. 9 shows an example of a liquid crystal display device, and is a cross-section taken along line g-h shown in FIG. 8A. A liquid crystal 822 is provided between an orientation film 821 formed to cover a wire 812 and a first electrode 813 and an orientation film 823 formed below an opposite substrate 706. In addition, a second electrode 824 is provided on the opposite substrate 706, and voltage applied to the liquid crystal 822 which is provided between the first electrode 813 and the second electrode 824 is controlled, so as to control transmission of light and display an image.

In addition, a spherical spacer 825 is provided in the liquid crystal 822 to control gap (cell gap) between the substrate 701 and the opposite substrate 706. The spacer 825 is not limited to a spherical shape, and a columnar spacer may be provided. The substrate 701 and the opposite substrate 706 are attached with the sealing material 705. A thin film transistor manufactured through any process shown in Embodiment Modes 1 to 7 can be applied to the thin film transistor 811.

Embodiment 3

In Embodiment 3, usage modes of the active matrix display device described in Embodiments 1 and 2 will be described with reference to drawings.

An example of an electronic device in which the above-mentioned active matrix display device is incorporated is described. For example, a video camera, a digital camera, a goggle type display (head-mounted display), a television set, a navigation system, a sound-reproducing device such as a car audio, a laptop computer, a game machine, a portable information terminal (such as a mobile computer, a cellular phone, a portable game machine, or an electronic book), and a portable image reproducing device equipped with a recording medium can be given. The invention disclosed in this specification can be applied to a display portion of these electronic devices.

Figure 10A:
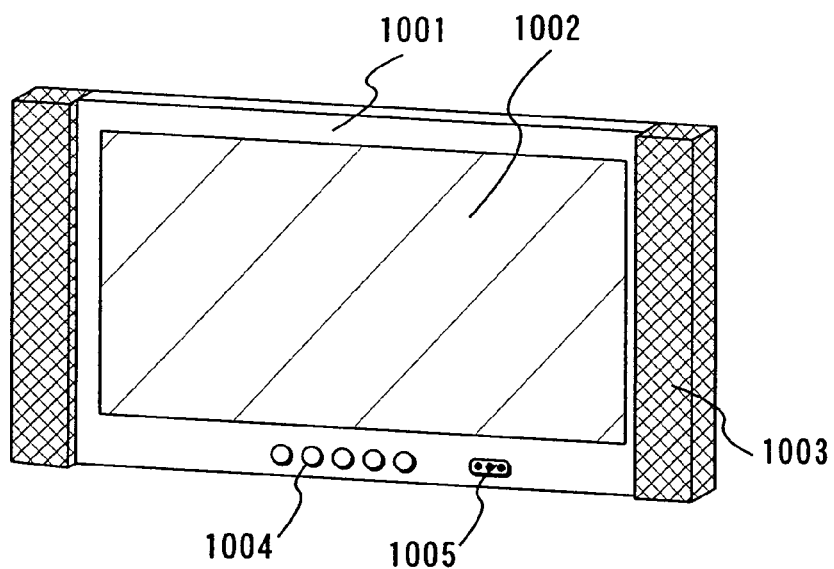
FIGS. 10A to 10C show electronic devices corresponding to Embodiment 3.

FIG. 10A shows an example of the television set and includes a chassis 1001, a display portion 1002, a speaker 1003, an operating portion 1004, a video input terminal 1005, and the like. By applying the thin film transistor manufactured in accordance with the invention disclosed in this specification to the display portion 1002, the television set can be manufactured. Since the thin film transistor manufactured in accordance with the invention disclosed in this specification is used in a pixel of the display portion 1002, there are few pixel defects. If a defect exists, it cannot be recognized by the human eyes. Accordingly, a bright and clear image can be displayed in the display portion 1002 without a display fault.

Figure 10B:
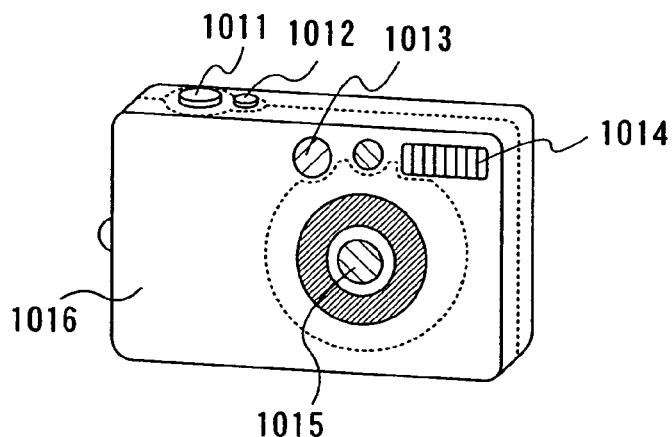
Figure 10C:
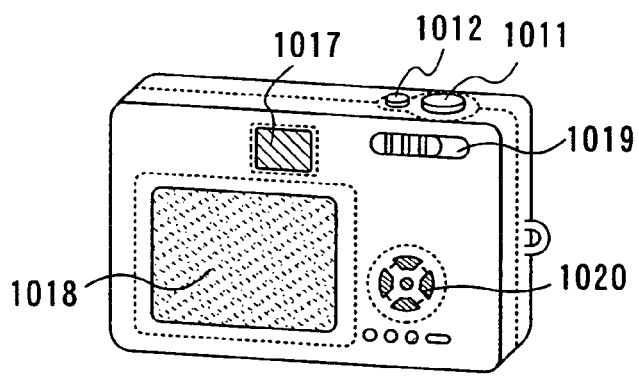

An example of the digital camera is shown in FIGS. 10B and 10C. FIG. 10B is a front view of the digital camera, and reference numeral 1011 denotes a release button; 1012, a main switch; 1013, a viewfinder; 1014, a stroboscope; 1015, a lens; and 1016, a chassis. FIG. 10C is a back view of the digital camera, and reference numeral 1017 denotes a viewfinder eyepiece window; 1018, a display portion; 1019, an operating button; and 1020, an operating button.

By applying the thin film transistor manufactured in accordance with the invention disclosed in this specification to the display portion 1018, the digital camera can be manufactured. Since the thin film transistor manufactured in accordance with the invention disclosed in this specification is used in a pixel of the display portion 1018, there are few pixel defects. If a defect exists, it cannot be recognized by the human eyes. Accordingly, a bright and clear image can be displayed in the display portion 1018 without a display fault.

It is obvious that the invention disclosed in this specification is not limited to the television set and the digital camera and can be applied to an active matrix display device which is incorporated in an electronic device including a display portion.

This application is based on Japanese Patent Application serial no. 2005-133713 filed in Japan Patent Office on Apr. 28, 2005, the entire contents of which are hereby incorporated by reference.

What is claimed is:

1. A manufacturing method of a thin film transistor, comprising the steps of:
    forming a base insulating film over a glass substrate;
    forming a pattern of a semiconductor film containing silicon over the base insulating film, wherein the pattern of the semiconductor film has a tapered shape at an edge portion of the pattern;
    forming a first insulating film by performing plasma oxidation using high electron density plasma with a frequency of 2.45 GHz to the pattern of the semiconductor film with a condition where a temperature of the glass substrate is set at a temperature 100° C. or more lower than a strain point of the glass substrate so that a thickness of a top portion of the first insulating film, a thickness of a side portion of the first insulating film and a corner portion of the first insulating film are same;
    forming a second insulating film containing nitrogen over the first insulating film by a CVD method;
    performing plasma nitridation to the second insulating film;
    forming a gate electrode over the second insulating film,
    wherein oxygen gas, hydrogen gas and an inert gas are provided to perform plasma oxidation, and
    wherein the base insulating film is formed with plasma nitridation of the glass substrate so as to form a silicon nitride or silicon nitride containing oxygen.

2. The manufacturing method of a thin film transistor according to claim 1, wherein the plasma oxidation is performed with a plasma which has an electron temperature of 0.5 eV or more and 1.5 eV or less and an electron density of $1 \times 10^{11}$ cm$^{-3}$ or more and $1 \times 10^{13}$ cm$^{-3}$ or less.

3. The manufacturing method of a thin film transistor according to claim 1, further comprising:
    forming a protective film over the gate electrode,
    wherein the protective film is in contact with the base insulating film.

4. The manufacturing method of a thin film transistor according to claim 1, wherein the first insulating film includes argon.

5. The manufacturing method of a thin film transistor according to claim 4, wherein concentration of the argon in the first insulating film is $1 \times 10^{15}$ atoms/cm$^3$ or more and $1 \times 10^{16}$ atoms/cm$^3$ or less.

6. The manufacturing method of a thin film transistor according to claim 1, wherein the second insulating film containing nitrogen is a silicon nitride film.

7. The manufacturing method of a thin film transistor according to claim 1, wherein hydrogen gas volume ratio to oxygen gas volume is 1.5 or less.

8. The manufacturing method of a thin film transistor according to claim 1, wherein the base insulating film comprises a silicon oxide containing nitrogen and a silicon nitride containing oxygen.

9. The manufacturing method of a thin film transistor according to claim 1, wherein plasma nitridation of the glass substrate is performed by using high electron density plasma with a frequency of 2.45 GHz.

* * * * *